US012625245B2

(12) United States Patent
Yang et al.

(10) Patent No.: US 12,625,245 B2
(45) Date of Patent: May 12, 2026

(54) PHASE-LOCKED LOOP, RADAR SYSTEM AND METHOD FOR RANDOMIZING INITIAL PHASES OF FMCW SIGNALS

(71) Applicant: CALTERAH SEMICONDUCTOR TECHNOLOGY (SHANGHAI) CO., LTD., Shanghai (CN)

(72) Inventors: Jianwei Yang, Shanghai (CN); Wenting Zhou, Shanghai (CN)

(73) Assignee: Calterah Semiconductor Technology (Shanghai) Co., Ltd., Shanghai (CN)

( * ) Notice: Subject to any disclaimer, the term of this patent is extended or adjusted under 35 U.S.C. 154(b) by 197 days.

(21) Appl. No.: 18/523,807

(22) Filed: Nov. 29, 2023

(65) Prior Publication Data

US 2024/0162908 A1 May 16, 2024

Related U.S. Application Data

(63) Continuation of application No. PCT/CN2022/138798, filed on Dec. 13, 2022.

(30) Foreign Application Priority Data

| | | |
|---|---|---|
| Mar. 3, 2022 | (CN) | 202210209724.1 |
| Mar. 31, 2022 | (CN) | 202210329940.X |
| Apr. 12, 2022 | (CN) | 202210379635.1 |

(51) Int. Cl.
*G01S 13/00* (2006.01)
*G01S 13/32* (2006.01)
(Continued)

(52) U.S. Cl.
CPC .............. *G01S 13/32* (2013.01); *G01S 13/34* (2013.01); *G06F 7/58* (2013.01); *H03K 3/84* (2013.01); *H03L 7/1976* (2013.01)

(58) Field of Classification Search
CPC .......... G01S 7/35; G01S 7/032; G01S 13/325; G01S 13/343; G01S 13/32; G01S 13/34
(Continued)

(56) References Cited

U.S. PATENT DOCUMENTS 10,992,304 B2 * 4/2021 Pavao Moreira ..... G01S 13/343
11,487,003 B2 * 11/2022 Bai ....................... G01S 13/343
(Continued)

FOREIGN PATENT DOCUMENTS

CN 105049039 A 11/2015
CN 109936365 A 6/2019
(Continued)

OTHER PUBLICATIONS

Calterah Semiconductor Technology (shanghai) Co.,Ltd., International Search Report with English translation, PCT/CN2022/138798, Feb. 22, 2023, 7 pgs.
(Continued)

*Primary Examiner* — Chuong P Nguyen
(74) *Attorney, Agent, or Firm* — USCH Law, PC

(57) ABSTRACT

Embodiments of the present disclosure disclose a phase-locked loop, a radar system and a method for randomizing initial phases of FMCW signals. The phase-locked loop includes a phase-locked loop circuit and a random control signal generator. In response to a clock signal indicating a respective target moment of one or more target moments, the random control signal generator inputs a random control signal to the phase-locked loop circuit, so that the accumulated value of the plurality of fractional frequency division values is converted into a random value, and that a plurality of phase differences respectively corresponding to the plurality of chirp signals form a non-arithmetic sequence.

20 Claims, 14 Drawing Sheets

(51) Int. Cl.

| | | |
|---|---|---|
| *G01S 13/34* | (2006.01) | |
| *G06F 7/58* | (2006.01) | |
| *H03K 3/84* | (2006.01) | |
| *H03L 7/197* | (2006.01) | |

(58) Field of Classification Search
USPC ................................................ 342/175, 200
See application file for complete search history.

(56) References Cited

U.S. PATENT DOCUMENTS

| | | | | |
|---|---|---|---|---|
| 11,609,303 | B2 * | 3/2023 | Stettiner ................. | G01S 7/356 |
| 11,789,137 | B2 * | 10/2023 | Subburaj ................. | H03L 7/197 |
| | | | | 342/128 |
| 12,523,745 | B2 * | 1/2026 | Gibas .................... | G01S 7/4056 |
| 2007/0080852 | A1 * | 4/2007 | Blumke .................... | G01S 7/35 |
| | | | | 342/134 |
| 2008/0284531 | A1 | 11/2008 | Hornbuckle | |
| 2010/0141314 | A1 | 6/2010 | Chen | |
| 2016/0018511 | A1 | 1/2016 | Nayyar et al. | |
| 2019/0089368 | A1 | 3/2019 | Mo et al. | |
| 2019/0260617 | A1 | 8/2019 | Ott | |
| 2020/0284874 | A1 | 9/2020 | Narayana et al. | |
| 2021/0399734 | A1 | 12/2021 | Mai et al. | |
| 2023/0216510 | A1 * | 7/2023 | Krichman Kalinka ... | H03L 7/18 |
| | | | | 342/200 |
| 2023/0417872 | A1 * | 12/2023 | Gibas .................... | H03C 3/0991 |
| 2024/0094335 | A1 | 3/2024 | Narayana et al. | |
| 2024/0297671 | A1 * | 9/2024 | Zhou ....................... | H03L 7/089 |
| 2025/0125809 | A1 * | 4/2025 | Yang .................... | H03L 7/0896 |
| 2025/0138148 | A1 * | 5/2025 | Subburaj ............... | G01S 13/584 |
| 2025/0383424 | A1 * | 12/2025 | Cherniak .................. | G01S 7/35 |

FOREIGN PATENT DOCUMENTS

| | | | | | |
|---|---|---|---|---|---|
| CN | 110224697 | A | | 9/2019 | |
| CN | 111693996 | A | | 9/2020 | |
| CN | 113078991 | A | | 7/2021 | |
| CN | 116743162 | A | * | 9/2023 | .......... H03L 7/1974 |
| CN | 117375606 | A | * | 1/2024 | .......... H03L 7/0818 |
| CN | 120110380 | A | * | 6/2025 | .............. H03L 7/18 |

OTHER PUBLICATIONS

Calterah Semiconductor Technology (Shanghai) Co., Ltd., European Search Report, EP22929643.9, May 23, 2025, 12 pgs.
Calterah Semiconductor Technology (Shanghai) Co., Ltd., Chinese First Examination Report with English Translation, Cn 202210329940. X, Mar. 20, 2026, 17 pgs.

* cited by examiner

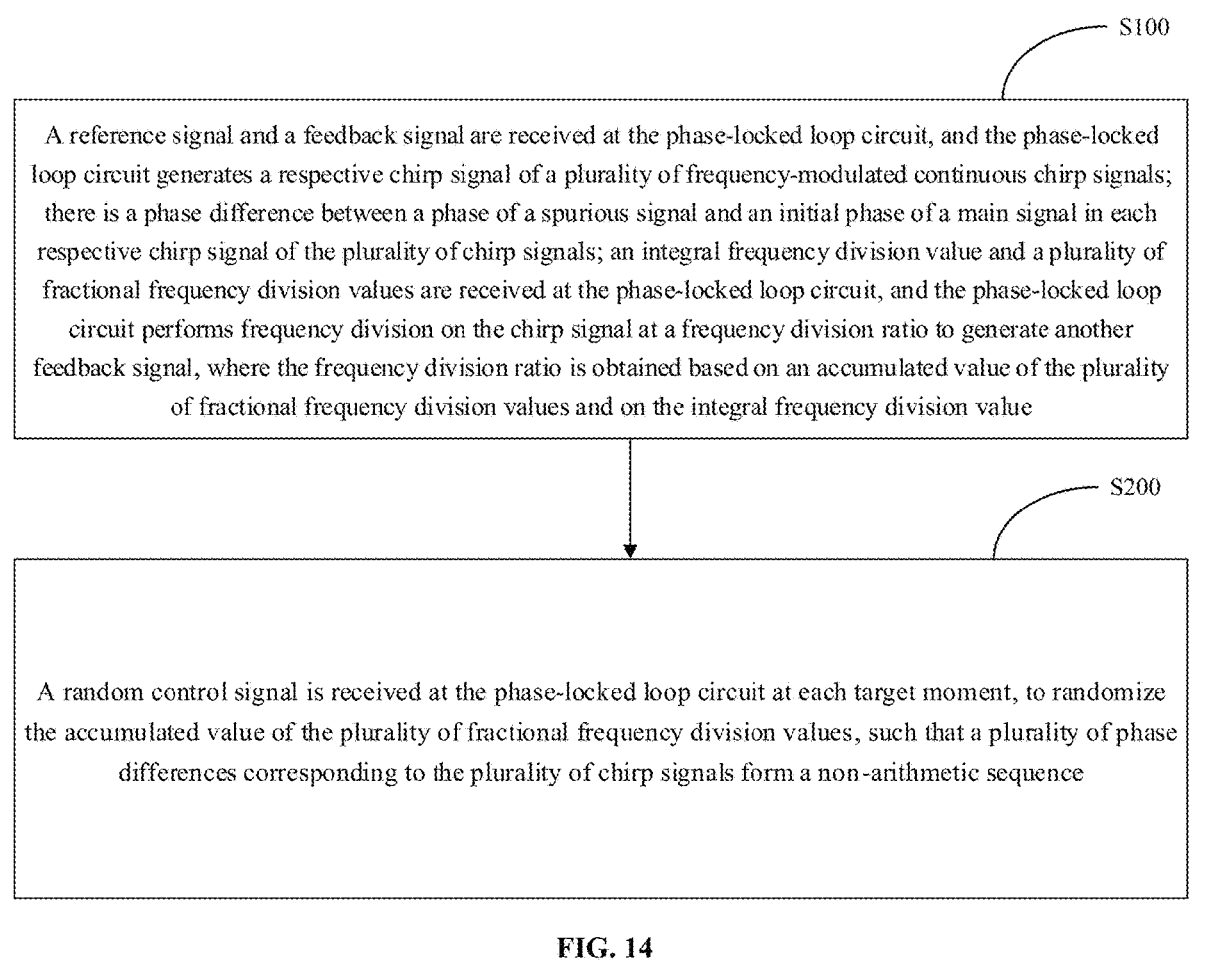

S100

A reference signal and a feedback signal are received at the phase-locked loop circuit, and the phase-locked loop circuit generates a respective chirp signal of a plurality of frequency-modulated continuous chirp signals; there is a phase difference between a phase of a spurious signal and an initial phase of a main signal in each respective chirp signal of the plurality of chirp signals; an integral frequency division value and a plurality of fractional frequency division values are received at the phase-locked loop circuit, and the phase-locked loop circuit performs frequency division on the chirp signal at a frequency division ratio to generate another feedback signal, where the frequency division ratio is obtained based on an accumulated value of the plurality of fractional frequency division values and on the integral frequency division value

S200

A random control signal is received at the phase-locked loop circuit at each target moment, to randomize the accumulated value of the plurality of fractional frequency division values, such that a plurality of phase differences corresponding to the plurality of chirp signals form a non-arithmetic sequence

FIG. 14

A reference signal and a feedback signal are received at the phase-locked loop circuit, and the phase-locked loop circuit generates a respective chirp signal of a plurality of frequency-modulated continuous chirp signals; there is a phase difference between a phase of a spurious signal and an initial phase of a main signal in each respective chirp signal of the plurality of chirp signals; an integral frequency division value and a plurality of fractional frequency division values are received at the phase-locked loop circuit, and the phase-locked loop circuit performs frequency division on the chirp signal at a frequency division ratio to generate another feedback signal, where the frequency division ratio is obtained based on an accumulated value of the plurality of fractional frequency division values and on the integral frequency division value

S210

The random sequence is received at the phase-locked loop circuit at one or more target moments

S220

The random sequence is added with the accumulated value of the plurality of fractional frequency division values, or the random sequence substitutes the accumulated value of the plurality of fractional frequency division values, so that the accumulated value of the plurality of fractional frequency division values is converted into the random value, and that the plurality of phase differences between phases of the plurality of spurious signals and initial phases of the plurality of respective main signals in the plurality of chirp signals form a non-arithmetic sequence

FIG. 15

PHASE-LOCKED LOOP, RADAR SYSTEM AND METHOD FOR RANDOMIZING INITIAL PHASES OF FMCW SIGNALS

CROSS REFERENCE TO RELATED APPLICATIONS

The present application is a continuation of PCT Patent Application No. PCT/CN2022/138798, filed Dec. 13, 2022, which claims priorities to Chinese Patent Applications No. CN 202210379635.1, filed on Apr. 12, 2022, No. CN 202210209724.1, filed on Mar. 3, 2022, and No. CN 202210329940.X, filed on Mar. 31, 2022, each of which is hereby incorporated by reference in its entirety.

TECHNICAL FIELD

Embodiments of the present disclosure relate to the field of phase-locked loops technology, and in particular to a phase-locked loop, a radar system and a method for randomizing initial phases of FMCW signals.

BACKGROUND

In a radar system, a frequency-modulated continuous wave (FMCW) signal is usually generated by a phase-locked loop (PLL). FIG. 1 shows a schematic diagram of the FMCW signal. As shown in FIG. 1, the segment from t1 to t2 represents a rising time period of the signal, the segment from t2 to t3 represents a falling time period of the signal, and the segment from t3 to t4 represents waiting time of the signal. In the duration from t1 to t4, the rising time period of the signal, the falling time period of the signal and the waiting time of the signal are referred to, as a whole, as a chirp signal. It can be seen that the FMCW signal includes a plurality of chirp signals having the same waveform.

According to the principle of a FMCW radar, the chirp signal is represented by the target and then forms an echo signal. FIG. 2 shows a schematic diagram of the chirp signal TX emitted by the FMCW radar system and the received echo signal Rx. The chirp signal Tx is mixed with the corresponding echo signal Rx and then form an intermediate frequency (IF) signal. The frequency of the IF signal represents the distance from the target object, and the phase difference between adjacent IF signals represents the velocity of the target object. However, in practical applications, when calculating the velocity of the target object based on the phase difference between adjacent IF signals, two false objects having fixed velocities always occur, which seriously affects the detection accuracy of the radar system.

SUMMARY

Embodiments of the present disclosure provide a phase-locked loop, a radar system and a method for randomizing initial phases of FMCW signals, in order to prevent two false objects having fixed velocities occur in the radar system, and improve the detection accuracy of the radar system.

Embodiments of the present disclosure provide:

A phase-locked loop which includes a phase-locked loop circuit and a random control signal generator.

The phase-locked loop circuit has a first input port, a second input port, a third input port, and a fourth input port. A reference signal is input at the first input port, a feedback signal is input at the second input port, an integral frequency division value is input at the third input port, and a plurality of fractional frequency division values are input at the fourth input port.

The phase-locked loop circuit is configured to generate a respective chirp signal of a plurality of frequency-modulated continuous chirp signals based on the reference signal and the feedback signal, and to perform frequency division on the respective chirp signal of the plurality of chirp signals at a frequency division ratio obtained based on an accumulated value of the plurality of fractional frequency division values and on the integral frequency division value, to generate another feedback signal that is fed back to the second input port.

There is a phase difference between a phase of a spurious signal and an initial phase of a main signal in each respective chirp signal of the plurality of chirp signals.

The random control signal generator includes a control port, and a clock signal is input at the control port.

In response to the clock signal indicating a respective target moment of one or more target moments, the random control signal generator inputs a random control signal to the fourth input port of the phase-locked loop circuit, so that the accumulated value of the plurality of fractional frequency division values is converted into a random value, and that a plurality of phase differences respectively corresponding to the plurality of chirp signals form a non-arithmetic sequence.

A radar system including the above-mentioned phase-locked loop, where the phase-locked loop is configured to generate a plurality of frequency-modulated continuous chirp signals.

A method for randomizing an initial phase of a FMCW signal, applicable to a phase-locked loop including a phase-locked loop circuit. The method includes:

receiving a reference signal and a feedback signal at the phase-locked loop circuit;

generating, by the phase-locked loop circuit, a respective chirp signal of a plurality of frequency-modulated continuous chirp signals, where there is a phase difference between a phase of a spurious signal and an initial phase of a main signal in each respective chirp signal of the plurality of chirp signals;

inputting an integral frequency division value and a plurality of fractional frequency division values to the phase-locked loop circuit, such that the phase-locked loop circuit performs frequency division on the plurality of chirp signals at a frequency division ratio obtained based on an accumulated value of the plurality of fractional frequency division values and on the integral frequency division value, to generate another feedback signal; and inputting a random control signal to the phase-locked loop circuit at each target moment of one or more target moments, to randomize the accumulated value, such that a plurality of phase differences respectively corresponding to the plurality of chirp signals form a non-arithmetic sequence.

The above-mentioned solutions have the following advantages:

The phase-locked loop provided by embodiments of the present disclosure includes a phase-locked loop circuit and a random control signal generator. The phase-locked loop circuit is configured to generate a respective chirp signal of a plurality of frequency-modulated continuous chirp signals based on the inputted reference signal and the inputted feedback signal, and to perform frequency division on the respective chirp signal of the plurality of chirp signals at a frequency division ratio, to generate another feedback signal; where the frequency division ratio is obtained based on an accumulated value of the inputted plurality of fractional frequency division values and on inputted integral frequency division value. In response to a clock signal being input at the control port and indicating a target moment, the random control signal generator inputs a random control signal to the phase-locked loop circuit, so that the accumulated value of the plurality of fractional frequency division values is converted into a random value, and that a plurality of phase differences respectively corresponding to the plurality of chirp signals form a non-arithmetic sequence. In other words, the equal-difference manner in which the plurality of phase differences increase or decrease is disrupted, and a plurality of pieces of velocity information resulting from the spurious signals in the plurality of chirp signals are distributed over different velocity dimensions. In this way, a strength of the spurious signals on individual velocity dimension can be decreased, and the two false objects having fixed velocities can be prevented from occurring in the radar system, thereby improving the detection accuracy of the radar system.

Moreover, in response to the clock signal indicating a target moment, the accumulated value of the plurality of fractional frequency division values is converted into a random value by inputting the random control signal to the phase-locked loop circuit, such that the phase differences of the main signals in the plurality of chirp signals relative to the reference signal vary randomly. In other words, the phases of the plurality of chirp signals emitted by the FMCW radar system vary randomly. In this way, the probability of signals emitted by the FMCW radar being interfered by other radar signals can be reduced, thereby improving the anti-interference ability of the FMCW radar system to external environment.

BRIEF DESCRIPTION OF THE DRAWINGS

In order to illustrate the technical solutions in related technologies or in the embodiments of the present disclosure more clearly, the drawings to be used in the description of the related technologies or the embodiments will be briefly described below. It is obvious that the drawings mentioned in the following description are only some embodiments of the present disclosure. For those of ordinary skill in the art, other drawings may be obtained in accordance with these drawings without any inventive effort.

FIGS. 14 and 15 are flow diagrams of the method for randomizing initial phases of FMCW signals according to some embodiments of the present disclosure.

DETAILED DESCRIPTION OF THE EMBODIMENTS

Figure 3:
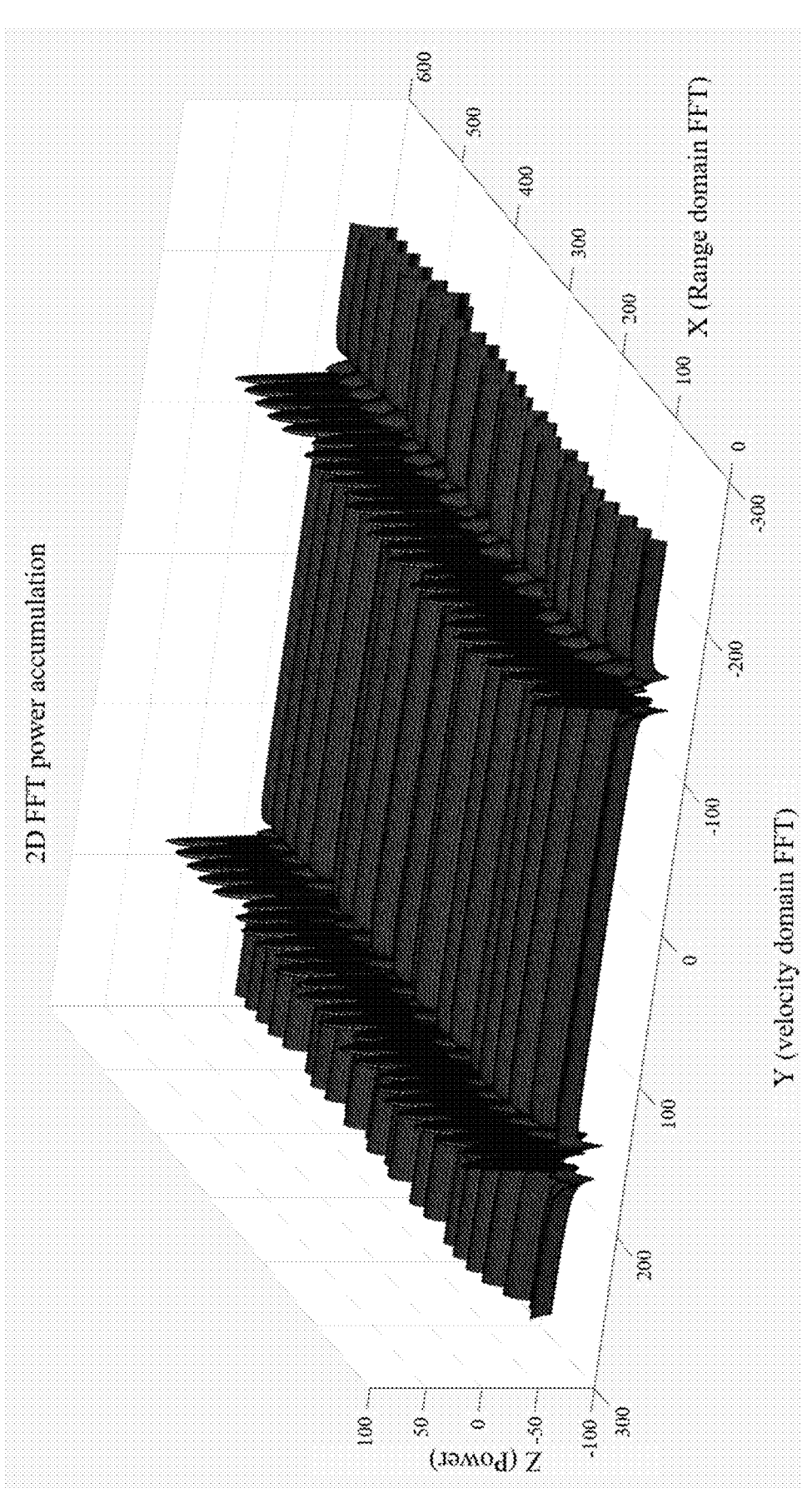
FIG. 3 is a schematic diagram of two false objects having fixed velocities occurred in a 2D FFT result of the FMCW radar system.

As discussed in the BACKGROUND section, in application, when calculating the velocity of the target object based on the phase difference between adjacent IF signals, two false objects having fixed velocities always occur, which seriously affects the detection accuracy of the radar system. FIG. 3 is a schematic diagram showing that two false objects having fixed velocities occur in a processing result of 2D fast Fourier transform (2D FFT) performed on IF signals by the FMCW radar system. As shown in FIG. 3, the two protruded and wall-shaped objects are the two false objects having fixed velocities occurred in the processing result of 2D FFT. These two false objects may present in all distance dimensions and occupy two velocity dimensions.

The inventor found, by research, that a phase-locked loop generates a chirp signal based on the reference signal input to the phase-locked loop and the feedback signal generated by the phase-locked loop. When frequency and a phase of the reference signal input to the phase-locked loop being same as frequency and a phase of the feedback signal generated by the phase-locked loop, the phase-locked loop is locked. A process of generating the feedback signal by the phase-locked loop includes performing frequency division on the chirp signal at a certain fractional frequency division ratio. It can be seen that when the phase-locked loop is locked, a frequency relationship between the chirp signal fout of the phase-locked loop and the reference signal fref input to the phase-locked loop is:

$$fout = fref*(N.frac) \tag{1}$$

herein the N.frac refers to the fractional frequency division ratio, N refers to an integral part, and .frac refers to a fractional part.

Figure 1:
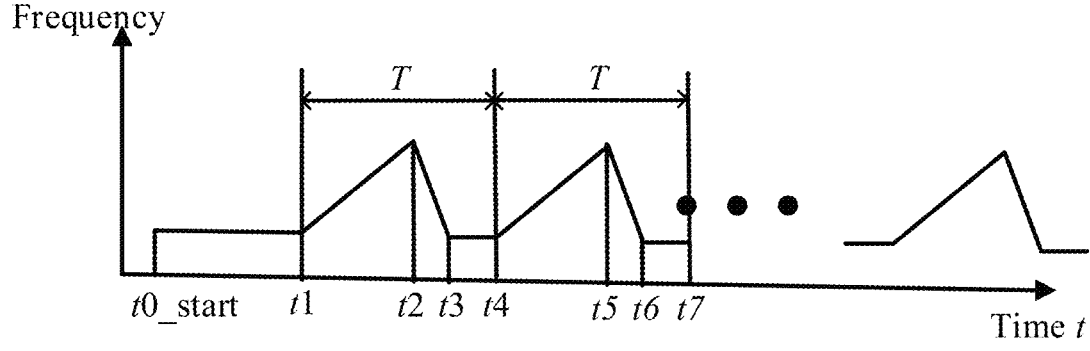
FIG. 1 is a schematic diagram of a FMCW signal.
Figure 2:
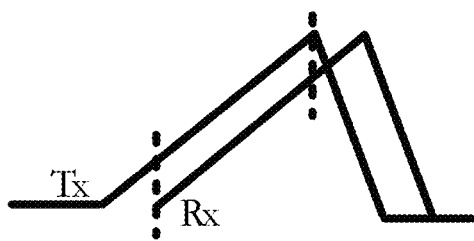
FIG. 2 is a schematic diagram of a chirp signal Tx emitted by a FMCW radar system and an echo signal Rx received by the FMCW radar system.

According to formula (1), as long as the fractional frequency division ratio N.frac changes according to the waveform of the FMCW signal (as shown in FIG. 1), the signal fout output by the phase-locked loop is the FMCW signal, i.e. a chirp signal. It should be noted that when performing fractional frequency division by the phase-locked loop, the fractional frequency division ratio varies between N and N+1, and N.frac is a final averaged frequency division ratio. However, instantaneous phase changes occur in the chirp signals output by the phase-locked loop when frequency division at a frequency division ratio varying between N and N+1 is performed on the chirp signals, resulting in a spurious signal generated by mixing the feedback signal generated by the frequency division with the reference signal input to the phase-locked loop. Thus, the chirp signals include not only main signals, but also spurious signals. Then, an echo signal represented by the target object also includes a main signal and a spurious signal.

The inventor found, by further research, that during generation of chirp signals, the phase-locked loop continuously accumulates the received fractional frequency division values. When the accumulated value of the fractional frequency division values exceeds a certain threshold, an overflow value is generated. The overflow value is added with the integral frequency division value received by the phase-locked loop to generate a frequency division ratio control signal. Under the control of the frequency division ratio control signal, the phase-locked loop can perform frequency division on the output chirp signals at a certain fractional frequency division ratio. Due to the overflow effect resulting from accumulation of the received fractional frequency division values by the phase-locked loop, as well as the repeatability of the FMCW waveforms, the accumulated values of the received fractional frequency division values each obtained at an initial moment of a respective chirp signal of the plurality of chirp signals form an arithmetic sequence. For example, as shown in FIG. 1, an accumulated value of fractional frequency division values at the beginning of a first chirp signal (i.e., moment t1 in FIG. 1) is dat0, an accumulated value of fractional frequency division values at the beginning of a second chirp signal (i.e., moment t4 in FIG. 1) is dat1, and so on, and an accumulated value of fractional frequency division values at the beginning of a n-th chirp signal is datn. It can be found that dat0, dat1 . . . datn form an arithmetic sequence.

The accumulated value of the fractional frequency division values received by the phase-locked loop determines the fractional frequency division ratio N.frac, which in turn determines a phase difference of a spurious signal relative to a main signal in each chirp signal of the plurality of chirp signals output by the phase-locked loop. Therefore, at an initial moment of each chirp signal of the plurality of chirp signals output by the phase-locked loop (for example, moments t1, t4, t7, or the like in FIG. 1), the phase differences of spurious signals relative to main signals in the plurality of chirp signals also form an arithmetic sequence. That is to say, a phase difference between a phase of a spurious signal and an initial phase of a main signal in each respective chirp signal always increases by a fixed value compared to a phase difference between a phase of a spurious signal and an initial phase of a main signal in a previous chirp signal.

According to the principle of a FMCW radar, a phase difference between adjacent IF signals represents the velocity of the target object. Each IF signal is formed by mixing of a chirp signal with a corresponding echo signal. Thus, when a main signal in an echo signal is mixed with a corresponding chirp signal to generate an IF signal (Sig_IF-_Main), a spurious signal in the echo signal is also mixed with the corresponding chirp signal to generate another IF signal (Sig_IF_Spur). Therefore, the fixed phase difference is formed between adjacent Sig_IF_Main signals and adjacent Sig_IF_Spur signals. The fixed phase difference would be converted into velocity information. In view of this, when processing the adjacent IF signals using 2D FFT, the energy of the spurious signals concentrates on two fixed velocity dimensions, resulting in two false objects having fixed velocities, thereby seriously affecting the detection accuracy of the radar system.

From the above analysis, it can be seen that in the FMCW radar system, when calculating the velocity of the target object based on the phase difference between adjacent IF signals, the fundamental reason for the occurrence of two false objects having fixed velocities is that at initial moments of the plurality of chirp signals (referring to moments t1, t4, t7, or the like in FIG. 1), the accumulated values of the fractional frequency division values vary in an equal-difference way, which in turn causes the equal-difference variation of the phase differences of the spurious signals relative to the main signals at the initial moments of the plurality of chirp signals generated by the phase-locked loop.

In view of the above, some embodiments of the present disclosure provide a phase-locked loop including a phase-locked loop circuit and a random control signal generator. In response to a clock signal being input at the control port and indicating a respective target moment of one or more target moments, the random control signal generator inputs a random control signal to the phase-locked loop circuit, so that the accumulated value of the plurality of fractional frequency division values is converted into a random value, and that a plurality of phase differences between phases of a plurality of spurious signals and initial phases of a plurality of respective main signals in the plurality of chirp signals form a non-arithmetic sequence. In other words, the equal-difference manner in which the plurality of phase differences increase or decrease is disrupted, and a plurality of pieces of velocity information resulting from the spurious signals in the plurality of chirp signals are distributed over different velocity dimensions. In this way, a strength of the spurious signals on individual velocity dimension can be decreased, and the two false objects having fixed velocities can be prevented from occurring in the radar system, thereby improving the detection accuracy of the radar system. Herein, the random control signal may be a digital signal or an analog signal, and correspond to a respective chirp signal of the plurality of chirp signals.

Moreover, in each chirp signal of the plurality of chirp signals output by the phase-locked loop, the accumulated value of the plurality of fractional frequency division values determines a phase difference of a main signal of the chirp signal relative to the reference signal input to the phase-locked loop. Therefore, in response to the clock signal indicating a target moment, the accumulated value of the plurality of fractional frequency division values is converted into a random value by inputting the random control signal to the phase-locked loop circuit, such that the phase differences of the main signals in the plurality of chirp signals relative to the reference signal vary randomly. In other words, the phases of the plurality of chirp signals emitted by the FMCW radar system vary randomly. In this way, the probability of signals emitted by the FMCW radar being interfered by other radar signals can be reduced, thereby improving the anti-interference ability of the FMCW radar system to external environment.

The following will provide a clear and complete description of the technical solutions in the embodiments of the present disclosure in conjunction with the accompanying drawings in the embodiments of the present disclosure. Obviously, the described embodiments are a part of the embodiments of the present disclosure, not all of them. Based on the embodiments of the present disclosure, all other embodiments obtained by those skilled in the art without any inventive work fall within the scope of protection of the present disclosure.

Many specific details are elaborated in the following description to facilitate a comprehensive understanding of the present application. However, the present application may be implemented in other ways different from those described herein. Those skilled in the art may make similar developments without departing from the spirit of the present disclosure. Therefore, the present disclosure is not limited to the specific embodiments described below.

Furthermore, the present disclosure is described in detail in conjunction with schematic diagrams. When detailing the embodiments of the present disclosure, for the convenience of description, the cross-sectional view showing the structure of component will not be locally enlarged according to the general scale, and the schematic diagrams are only examples, which should not be regarded as limiting of the scope of protection of the present disclosure. In addition, in actual production, three-dimensional spatial dimensions including length, width, and depth should be taken into account.

Figure 4:
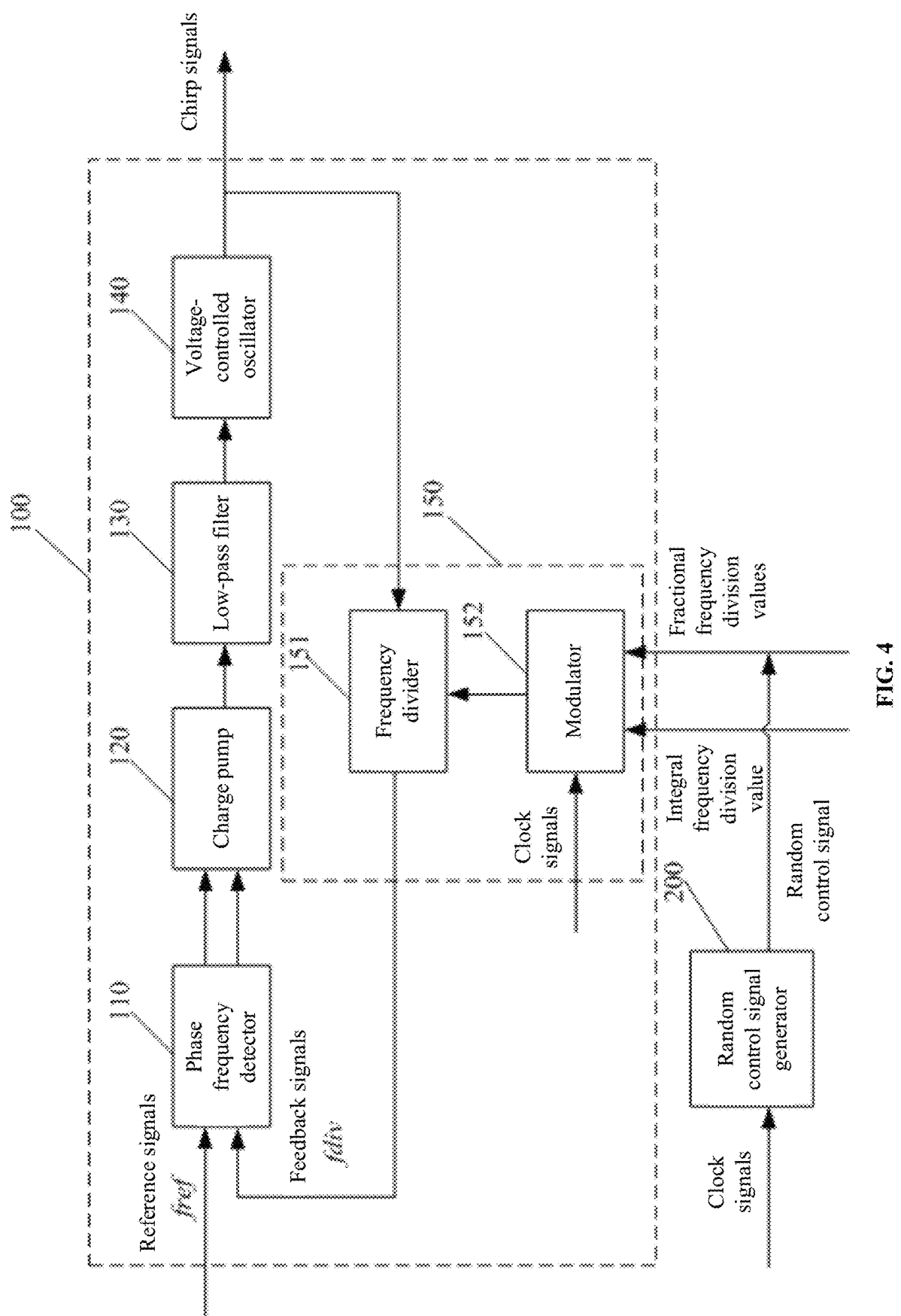
FIGS. 4 to 7 are systemic block diagrams of the phase-locked loop according to some embodiments of the present disclosure.

FIG. 4 is a structural diagram of the phase-locked loop according to some embodiments of the present disclosure. As shown in FIG. 4, the phase-locked loop includes a phase-locked loop circuit 100 and a random control signal generator 200.

The phase-locked loop circuit 100 has a first input port, a second input port, a third input port, and a fourth input port. In response to a reference signal fref being input at the first input port, a feedback signal fdiv being input at the second input port, an integral frequency division value being input at the third input port, and a fractional frequency division value being input at the fourth input port, the phase-locked loop circuit 100 is configured to generate a respective chirp signal of a plurality of frequency-modulated continuous chirp signals based on the reference signal fref and the feedback signal fdiv, and to perform frequency division on the respective chirp signal of the plurality of chirp signals at a frequency division ratio N.frac obtained based on an accumulated value of the plurality of fractional frequency division values and on the integral frequency division value, to generate another feedback signal fdiv that is fed back to the second input port. There is a phase difference between a phase of a spurious signal and an initial phase of a main signal in each respective chirp signal of the plurality of chirp signals.

The random control signal generator 200 includes a control port. In response to a clock signal being input at the control port and indicating a target moment, the random control signal generator 200 inputs a random control signal to the fourth input port of the phase-locked loop circuit 100, so that the accumulated value of the fractional frequency division values is converted into a random value, and that a plurality of phase differences respectively corresponding to the plurality of chirp signals 100 form a non-arithmetic sequence.

In embodiments of the present disclosure, the fourth input port of the phase-locked loop circuit 100 continuously receives fractional frequency division values, and the phase-locked loop circuit 100 accumulates the received fractional frequency division values. When the accumulated value of the fractional frequency division values exceeds a preset threshold, an overflow occurs. The remaining accumulated value after the overflow is accumulated, as a new accumulated value, with received fractional frequency division values. Herein, the preset threshold is the maximum value that can be expressed by an accumulator configured to accumulate the fractional frequency division values in the phase-locked loop circuit 100.

For example, the fractional frequency division value received by the phase-locked loop circuit 100 each time is 0.3 and the preset threshold is 1, then the accumulated value of four fractional frequency division values received by the phase-locked loop circuit 100 is: 0.3+0.3+0.3+0.3=1.2. At this point, 1.2 exceeds the preset threshold of 1, an overflow of integer 1 occurs, and the remaining 0.2 is accumulated, as a new accumulated value, with the subsequently received fractional frequency division values.

From the above analysis, it can be seen that during generation of chirp signals by the existing phase-locked loop circuit, the fractional frequency division values received at the fourth input port of the phase-locked loop circuit are continuously accumulated. When the accumulated value of the fractional frequency division values exceeds the certain threshold, an overflow occurs. Due to the overflow effect of the accumulation and the repeatability of the FMCW waveforms, the accumulated values of the received fractional frequency division values each obtained at an initial moment of a respective chirp signal (referring to moments t1, t4, t7, or the like in FIG. 1) of the plurality of chirp signals form an arithmetic sequence. Thus, a phase difference between a phase of a spurious signal and an initial phase of a main signal in each respective chirp signal generated by the phase-locked loop circuit always increases by a fixed value compared to a phase difference between a phase of a spurious signal and an initial phase of a main signal in a previous chirp signal generated by the phase-locked loop circuit. The change in phases of IF signals corresponding to adjacent chirp signals would be converted into velocity information. Thus, when processing the IF signals corresponding to the adjacent chirp signals using 2D FFT, the energy of the spurious signals concentrates on two fixed velocity dimensions, resulting in two false objects having fixed velocities, thereby seriously affecting the detection accuracy of the radar system.

In view of this, in order to solve the above problem, a random control signal generator 200 is added to the phase-locked loop. In response to a clock signal being input at the control port of the random control signal generator 200 and indicating a target moment, the random control signal generator 200 inputs a random control signal to the fourth input port of the phase-locked loop circuit 100, so that the accumulated value of the fractional frequency division values is converted into a random value, and that a plurality of phase differences between phases of a plurality of spurious signals and initial phases of a plurality of respective main signals in the plurality of chirp signals form a non-arithmetic sequence.

Moreover, from the above analysis, it can be seen that when the phase-locked loop is locked, a frequency relationship between a chirp signal fout output by the phase-locked loop circuit 100 and the reference signal fref input to the phase-locked loop circuit is:

$$fout =_f ref*(N.frac) \tag{1}.$$

In the formula (1), fout is a main signal in the chirp signal output by the phase-locked loop circuit 100. It can be seen from the formula (1) that a phase difference of the main signal fout in the chirp signal relative to the reference signal fref input to the phase-locked loop circuit 100 also depends on the fractional frequency division ratio N.frac of the phase-locked loop circuit 100, and the fractional frequency division ratio N.frac is determined by the accumulated value of the fractional frequency division values received by the phase-locked loop circuit 100. Thus, in the embodiments of the present disclosure, in response to the clock signal indicating a target moment, the random control signal generator 200 inputs a random control signal to the fourth input port of the phase-locked loop circuit 100, so that the accumulated value of the fractional frequency division values is converted into a random value, and that a plurality of phase differences of the plurality of main signals in the plurality of chirp signals relative to the reference signal fref vary randomly. In other words, the phases of the plurality of chirp signals emitted by the FMCW radar system vary randomly. In this way, the probability of signals emitted by the FMCW radar being interfered by other radar signals can be reduced, thereby improving the anti-interference ability of the FMCW radar system to external environment.

It should be noted that a phase difference between a phase of a spurious signal and an initial phase of a main signal in a chirp signal refers to a phase difference of the spurious signal relative to the main signal at an initial moment of the chirp signal, and a phase difference between a phase of a spurious signal and an initial phase of a main signal in a next chirp signal refers to a phase difference of the spurious signal relative to the main signal at an initial moment of the next chirp signal. Therefore, a phase difference between a phase of a spurious signal and an initial phase of a main signal in each respective chirp signal of the plurality of chirp signals refers to a phase difference of the spurious signal relative to the main signal at an initial moment of the each respective chirp signal. Herein, the initial moments of the plurality of chirp signals generated by the phase-locked loop circuit 100 may be the moments such as t1, t4, t7, and the like as shown in FIG. 1.

Thus, at any moment or a plurality of moments within a cycle of a chirp signal output by phase-locked loop circuit 100, a random control signal is input to the fourth input port of the phase-locked loop circuit 100 by the random control signal generator 200, so that the accumulated value of the fractional frequency division values is converted into a random value, and that a phase difference of a spurious signal relative to a main signal in the chirp signal varies randomly at this moment, and a phase difference of a spurious signal relative to a main signal in a next chirp signal also varies randomly at an initial moment of the next chirp signal. In this case, both the phase differences of the spurious signals relative to the main signals in the two chirp signals vary randomly. Similarly, a plurality of phase differences between phases of a plurality of spurious signals and initial phases of a plurality of respective main signals in the plurality of chirp signals form a non-arithmetic sequence. It can be seen that the one or more target moments may be any moment or a plurality of moments within the cycle of the chirp signal.

A cycle of any chirp signal has a useful signal time period and a useless signal time period. For example, as shown in FIG. 1, the useful signal time period includes a rising time period, and the useless signal time period includes a falling time period and a waiting time period. For another example, as shown in FIG. 1, the useful signal time period includes the falling time period, and the useless signal time period includes the rising time period and the waiting time period. Therefore, in order to prevent affecting the useful signal time period of the chirp signal, in some embodiments of the present disclosure, the one or more target moments refer to one or more moments within a time period starting from an ending moment of a useful signal time period of a respective chirp signal of the plurality of chirp signals and ending at a beginning moment of a useful signal time period of a next chirp signal.

In some embodiments, a target moment may be an initial moment of a useful signal time period of a respective chirp signal. For example, as shown in FIG. 1, the one or more useful signal time periods of the respective one or more chirp signals are one or more rising time periods, then the one or more target moments may refer to the moments t1, t4, t7, and the like.

In some embodiments, the one or more target moments may refer to one or more moments within a useless signal time period of a respective chirp signal. For example, as shown in FIG. 1, the useful signal time period of the respective chirp signal is the rising time period, and the useless signal time period of the respective chirp signal is the falling time period and the waiting time period. Then, the one or more target moments may refer to one or more moments within the falling time period and the waiting time period of the respective chirp signal.

It should also be noted that since the one or more target moments should correspond to the plurality of chirp signals in the time domain, one clock signal driving the random control signal generator 200 should correspond to one respective chirp signal of the plurality of frequency-modulated continuous chirp signals in the time domain. When the phase-locked loop circuit 100 is locked, the reference signal fref and the feedback signal fdiv both correspond to a respective chirp signal of the plurality of frequency-modulated continuous chirp signals in the time domain. Therefore, the clock signal may be generated based on the reference signal fref or the feedback signal fdiv.

In some embodiments, the clock signal is generated based on the feedback signal fdiv. For example, the feedback signal fdiv may be used as the clock signal to drive the random control signal generator 200 to input the random control signals to the fourth input port of the phase-locked loop circuit 100 at each target moment.

The phase-locked loop provided by the embodiments of the present disclosure utilizes the random control signal generator 200 to input a random control signal to the fourth input port of the phase-locked loop circuit 100 at each target moment, so that the accumulated value of the plurality of fractional frequency division values is converted into a random value, and that a plurality of phase differences between phases of a plurality of spurious signals and initial phases of a plurality of respective main signals in the plurality of chirp signals form a non-arithmetic sequence. In other words, the equal-difference manner in which the plurality of phase differences increase or decrease is disrupted, and a plurality of pieces of velocity information resulting from the spurious signals in the plurality of chirp signals are distributed over different velocity dimensions. In this way, a strength of the spurious signals on individual velocity dimension can be decreased, and the two false objects having fixed velocities can be prevented from occurring in the radar system, thereby improving the detection accuracy of the radar system. Moreover, at each target moment, the accumulated value of the plurality of fractional frequency division values is converted into a random value, such that the phase differences of the main signals in the plurality of chirp signals relative to the reference signal fref vary randomly. In other words, the phases of the plurality of chirp signals emitted by the FMCW radar system vary randomly. In this way, the probability of signals emitted by the FMCW radar being interfered by other radar signals can be reduced, thereby improving the anti-interference ability of the FMCW radar system to external environment.

In the above embodiments, the random control signal may be an instruction signal or a data signal, which will be described in detail below.

When the random control signal is an instruction signal, the phase-locked loop circuit 100 is instructed by the random control signal to convert the accumulated value of the plurality of fractional frequency division values into a random value, so that a plurality of phase differences between phases of a plurality of spurious signals and initial phases of a plurality of respective main signals in the plurality of chirp signals form a non-arithmetic sequence. Based on this, there are a plurality of methods for identifying whether the clock signal indicates a target moment, which will be described in detail below.

Embodiment one: the random control signal generator 200 has the function of identifying whether the clock signal indicates a target moment, and when the respective clock signal indicates the target moment, the random control signal generator sends a random control signal to the phase-locked loop circuit 100, that is to say, the moment at which the phase-locked loop circuit 100 receives the random control signal is the target moment. In response to receiving the random control signal, the phase-locked loop circuit 100 converts the accumulated value of the plurality of fractional frequency division values into a random value.

Embodiment two: the random control signal generator 200 does not have the function of identifying whether the clock signal indicates a target moment. In this case, another processor is used to identify whether the respective clock signal indicates the target moment, and to instruct the random control signal generator 200 to input the random control signal to the phase-locked loop circuit 100 when the respective clock signal indicates the target moment.

Figure 5:
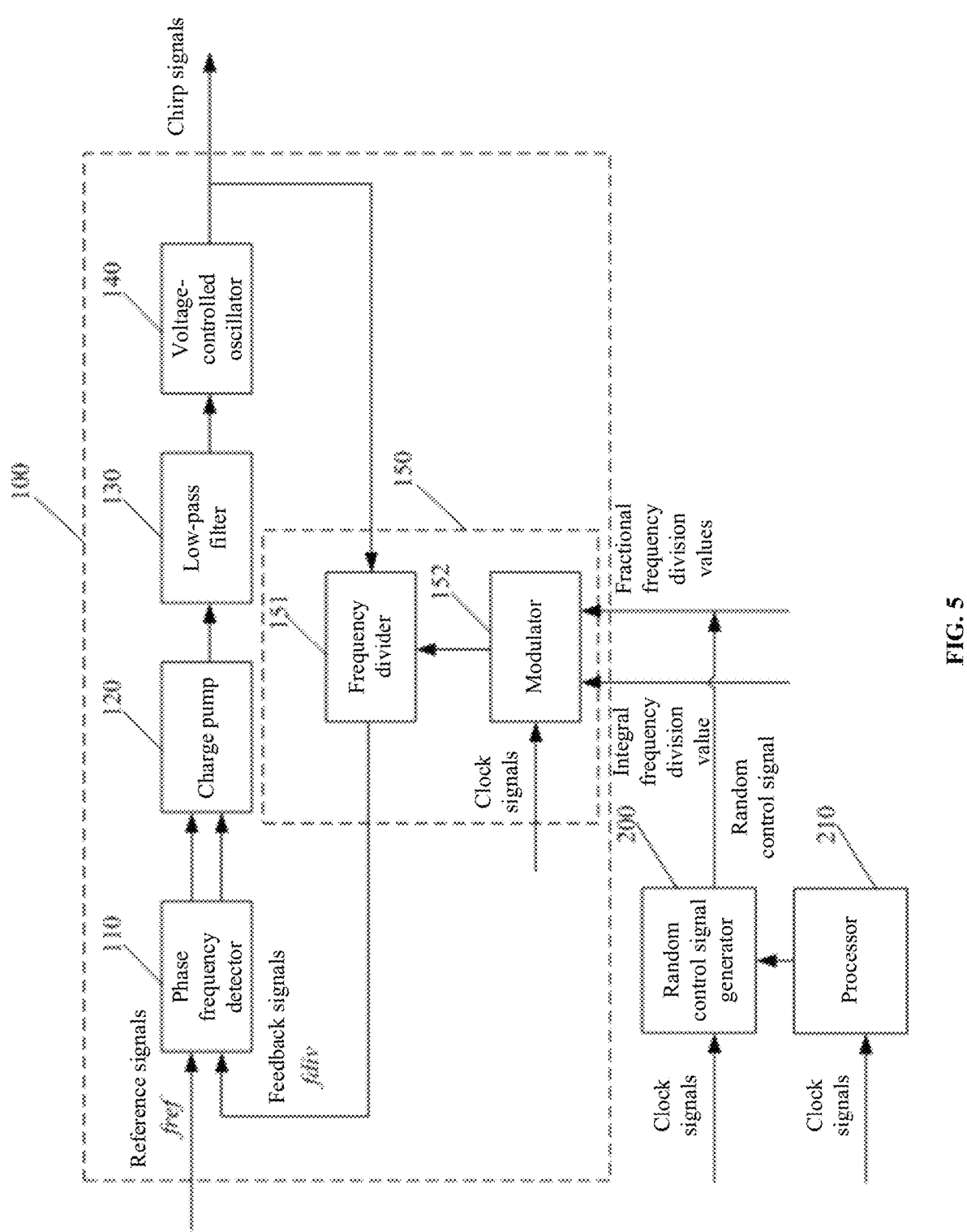

Based on the Embodiment two, in some embodiments, as shown in FIG. 5, the phase-locked loop further includes a processor 210 configured to detect whether the respective clock signal indicates the target moment, and to instruct the random control signal generator 200 to send the random control signal to the fourth input port of the phase-locked loop circuit 100 when the respective clock signal indicates the target moment. The random control signal is configured to instruct the phase-locked loop circuit 100 to convert the accumulated value of the plurality of fractional frequency division values into a random value. Here the processor 210 has the function of identifying whether the respective clock signal indicates the target moment.

Figure 6:
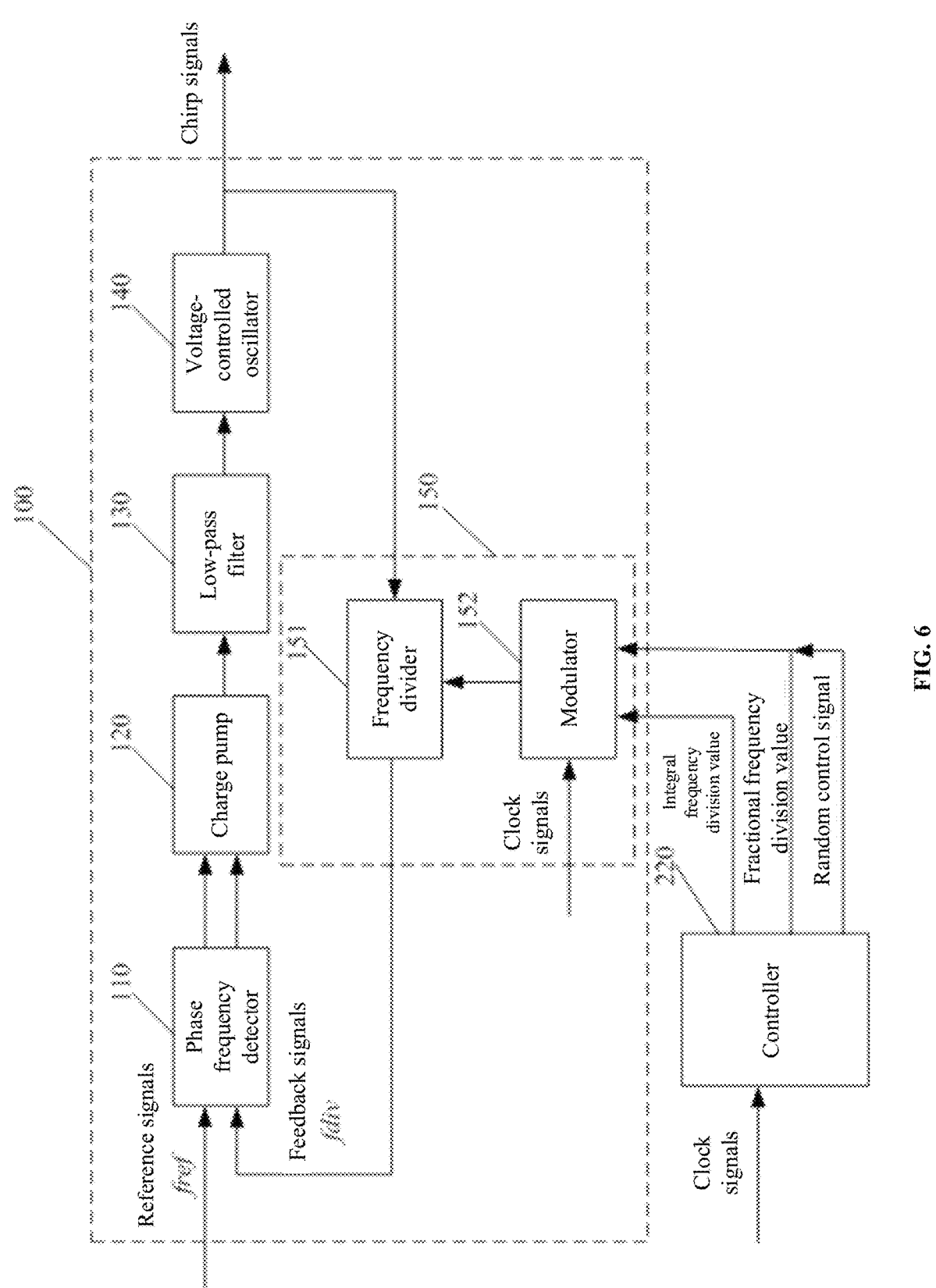

It should be noted that in some embodiments, as shown in FIG. 6, a processor 220 may be configured to receive the clock signal, and input the integral frequency division value to the third input port of the phase-locked loop circuit 100 and input the plurality of fractional frequency division values to the fourth input port of the phase-locked loop circuit 100 under control of the clock signal. Based on this, in some embodiments, as shown in FIG. 6, the random control signal generator 200 may include the processor 220, the processor 220 is further configured to send the random control signal to the fourth input port of the phase-locked loop circuit 100. The random control signal is configured to instruct the phase-locked loop circuit 100 to convert the accumulated value of the plurality of fractional frequency division values into a random value when the respective clock signal indicates the target moment. In this case, the functions of the random control signal sent by the controller 220 to the phase-locked loop circuit 100 may include:

Function one: the moment at which the controller 220 sends the random control signal to the phase-locked loop circuit 100 is the target moment. In this case, the phase-locked loop circuit 100 synchronously receives the random control signal, and the random control signal instructs the phase-locked loop circuit 100 to convert the accumulated value of the plurality of fractional frequency division values into a random value when the random control signal is received. In this case, the controller 220 has the function of identifying the target moment, in other words, the controller 220 identifies the target moment based on the received clock signal.

Function two: the controller 220 sends the random control signal to the phase-locked loop circuit 100 to instruct the phase-locked loop circuit 100 to identify the target moment, and convert the accumulated value of the plurality of fractional frequency division values into a random value at the target moment.

When the random control signal is a data signal, since the accumulated value of the plurality of fractional frequency division values is in a form of binary data of 0 and 1, the random control signal may include a random sequence configured to add with or substitute the accumulated value of the plurality of fractional frequency division values, so that the accumulated value of the plurality of fractional frequency division values is converted into the random value. Herein, the random sequence is also in the form of binary data of 0 and 1.

In response to the respective clock signal indicating the target moment, the random control signal generator 200 inputs the random sequence to the fourth input port of the phase-locked loop circuit 100, and the random sequence is added with or substitutes the accumulated value of the plurality of fractional frequency division values, so that the accumulated value is converted into the random value.

Because high-order bits have relatively high weights, in order to achieve better randomness, the accumulated value of the plurality of fractional frequency division values is obtained based on the random sequence. The random sequence is added with or substitutes, from high-order bits to low-order bits of the accumulated value, the accumulated value bit by bit. In this way, significant disturbance can be brought to the accumulated value, and the higher order of the bit of the accumulated value, the greater the disturbance caused by the random sequence.

For example, the accumulated value of the plurality of fractional frequency division values has M bits, the random sequence has N bits, and M≥N. The random sequence may be added with or substitutes, from high-order bits to low-order bits of the accumulated value, N bits of the accumulated value bit by bit, in order to disturb the high-order bits of the accumulated value of the plurality of fractional frequency division values and obtain better random effects.

In the present disclosure, there are more than one embodiment of generating the random sequence by the random control signal generator 200. These embodiments will be described in detail below.

Figure 7:
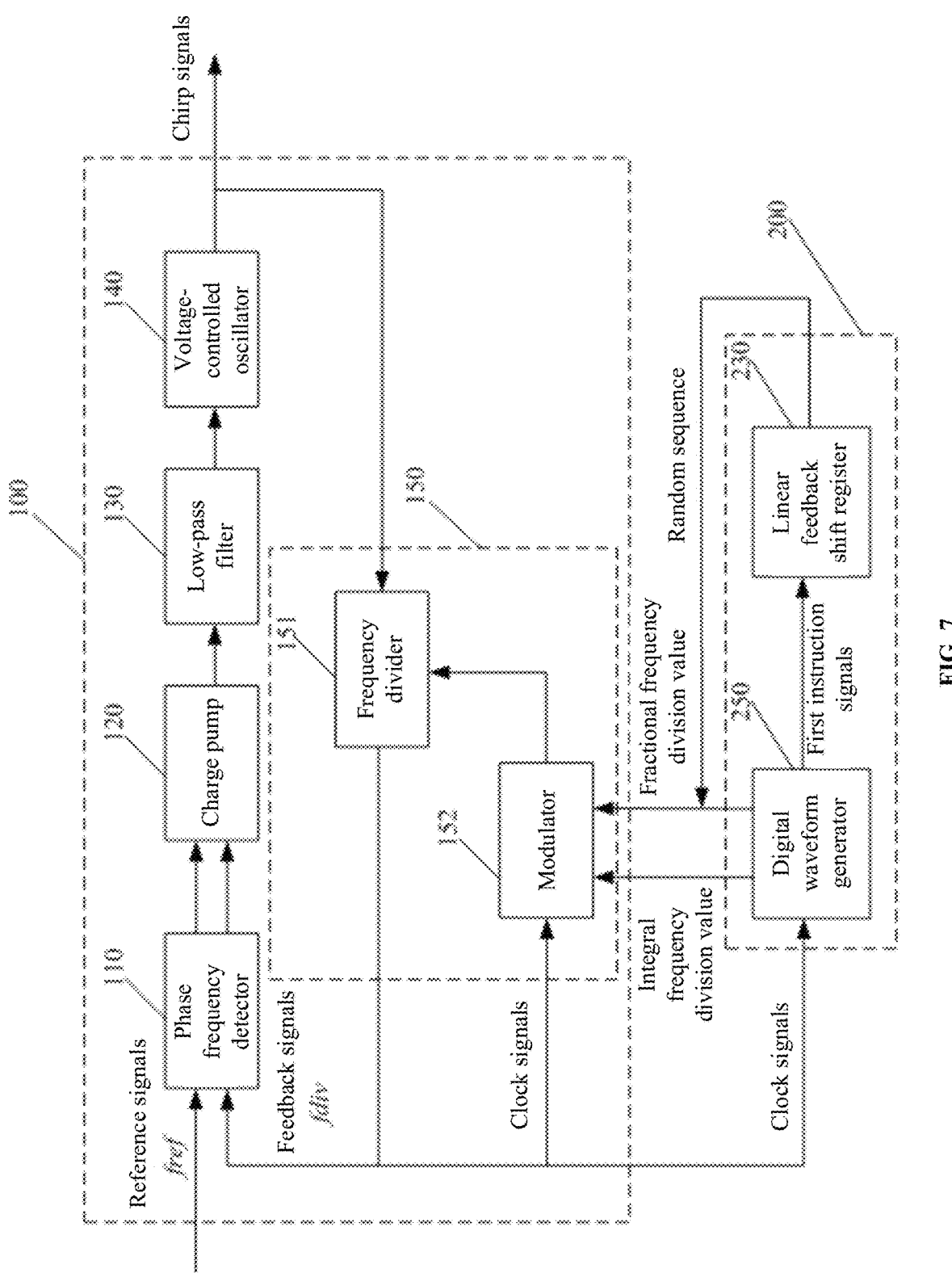

Embodiment one: as shown in FIG. 7, the random control signal generator 200 includes a linear feedback shift register (LFSR) 230. A control port of the linear feedback shift register 230 is configured to receive a first instruction signal generated based on the clock signal. The first instruction signal is configured to instruct the linear feedback shift register 230 to operate for one time in response to the clock signal, and the LFSR 230 generates one random sequence to output to the fourth input port of the phase-locked loop circuit 100, so that the accumulated value of the plurality of fractional frequency division values is converted into the random value.

Figure 8:
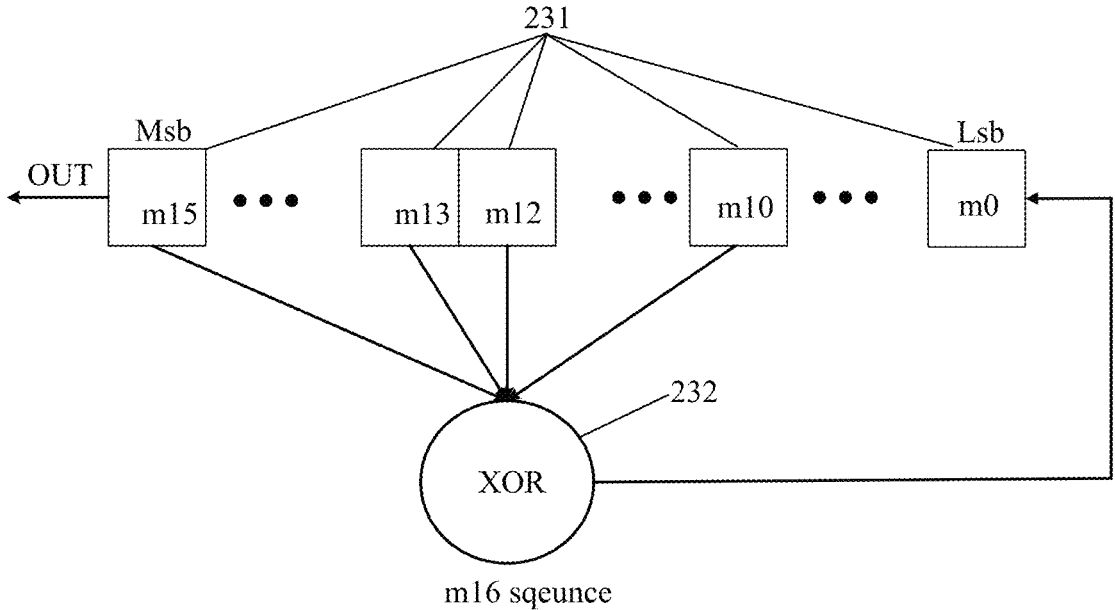
FIG. 8 is a structural block diagram of a linear feedback shift register in the phase-locked loop according to some embodiments of the present disclosure.

In some embodiments, as shown in FIG. 8, the linear feedback shift register 230 includes X levels of registers 231 and an XOR gate circuit 232 arranged in sequence, where X is an integer greater than 1. The data stored in the M-th level of register of the X levels of registers is shifted to the (M+1)-th level of register, and the data stored in the X-th level of register is shifted out, where 1≤M<X. At the same time, the XOR gate circuit 232 performs XOR calculation on the data stored in a part of registers of the X levels of registers, and feeds result of the XOR calculation back to the first level of register. At any time when the linear feedback shift register 230 is running, the data stored in the registers of the X levels of registers 231 constitutes a random sequence having X bits for outputting.

For example, as shown in FIG. 8, taking a linear feedback shift register 230 including 16 levels of registers as an example, in which the data stored in the first level of register is m0, the data stored in the second level of register is m1, and so on, the data stored in the 16-th level of register is m15, and the data stored in the 16 levels of registers constitutes a 16-bit storage sequence m0, m1 . . . m15, where each of m0, m1 . . . m15 is 0 or 1. In the 16-bit sequence stored in the 16 levels of registers, m0 is the least significant bit, m15 is the most significant bit, the bits of the storage sequence m0, m1 . . . m15 are sequentially shifted from the least significant bit to the most significant bit, and m15 is shifted out of the sequence. The XOR gate circuit 232 performs XOR calculation on the data m10 stored in the 11-th level of register, the data m12 stored in the 13-th level of register, the data m13 stored in the 14-th level of register, and the data m15 stored in the 16-th level of register, and feeds the result of the XOR calculation back to the first level of register as the data m0 stored in the first level of register.

Since the data stored in each level of register may be 0 or 1, the 16-level linear feedback shift register 230 can store 2^15−1 storage sequences. Among them, the case that the data stored in each register of the linear feedback shift register 230 is 0 is excluded. This is because when the data stored in each register of the linear feedback shift register 230 is 0, the value fed back to the first level of register by the XOR gate circuit 232 is always 0. Thus, all sequences output by the linear feedback shift register 230 will be constituted by 0, which are not available. For example, a three-level linear feedback shift register can traverse a maximum of 2^3−1 (i.e. 7) storage sequences of 001, 010, 011, 100, 101, 110, and 111.

In some embodiments, after receiving the first instruction signal, the linear feedback shift register 230 is instructed by the first instruction signal to operate for one time in response to the clock signal indicating a target moment, such that the linear feedback shift register 230 generates one random sequence having for example X bits output to the fourth input port of the phase-locked loop circuit 100. The random sequence is added with or substitutes, by the phase-locked loop circuit 100, the accumulated value of the plurality of fractional frequency division values, such that the accumulated value of the plurality of fractional frequency division values is converted into a random value.

Figure 9:
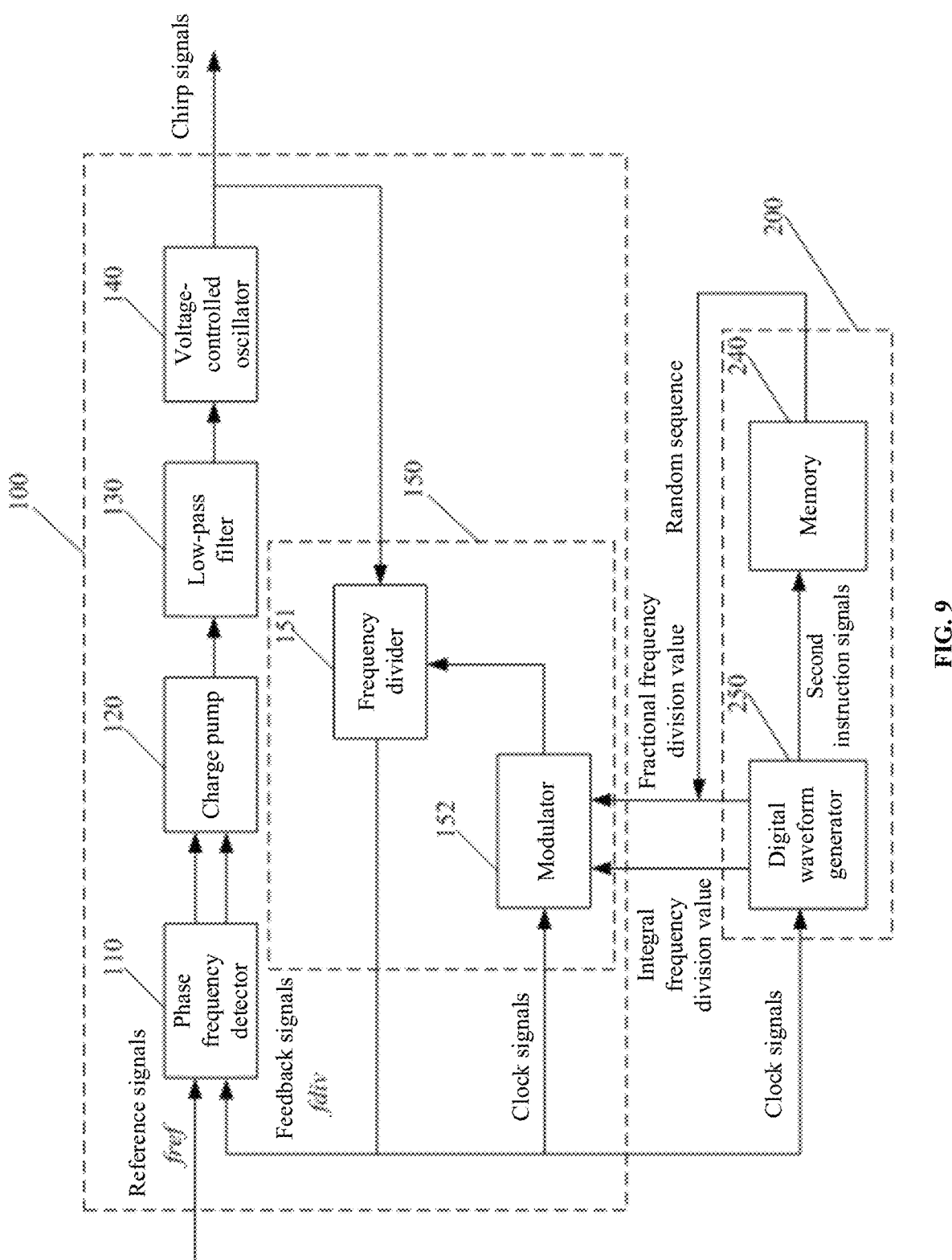
FIGS. 9 to 11 are systemic block diagrams of the phase-locked loop according to some embodiments of the present disclosure.

Embodiment two: as shown in FIG. 9, the random control signal generator 200 includes a memory 240. A control port of the memory 240 is configured to receive a second instruction signal generated based on the clock signal. The second instruction signal is configured to instruct the memory 240 to output one pre-stored random sequence to the fourth input port of the phase-locked loop circuit 100 in response to the clock signal indicating the target moment, so that the accumulated value of the plurality of fractional frequency division values is converted into the random value.

Based on Embodiment two, in some embodiments, the memory 240 has the function of storing data, allowing random sequences to be pre-stored in the memory 240. Then, the memory 240 is instructed by the second instruction signal to output one pre-stored random sequence to the fourth input port of the phase-locked loop circuit 100 in response to the clock signal indicating the target moment. The random sequence is added with or substitutes, by the phase-locked loop circuit 100, the accumulated value of the plurality of fractional frequency division values, such that the accumulated value of the plurality of fractional frequency division values is converted into a random value.

In some other embodiments, the memory 240 may further include an arithmetic unit and a serial peripheral interface (SPI). The arithmetic unit generates the random sequences based on preset computer instructions, and the SPI is instructed by the second instruction signal to output one random sequence generated by the arithmetic unit to the fourth input port of the phase-locked loop circuit 100 in response to the clock signal indicating the target moment. The random sequence is added with or substitutes, by the phase-locked loop circuit 100, the accumulated value of the plurality of fractional frequency division values, such that the accumulated value of the plurality of fractional frequency division values is converted into a random value.

In some other embodiments, the memory 240 may only include the SPI. The SPI is instructed by the second instruction signal to output an artificial random sequence or a random sequence output by other devices to the fourth input port of the phase-locked loop circuit 100 in response to the clock signal indicating the target moment. The random sequence is added with or substitutes, by the phase-locked loop circuit 100, the accumulated value of the plurality of fractional frequency division values, such that the accumulated value of the plurality of fractional frequency division values is converted into a random value.

Figure 10:
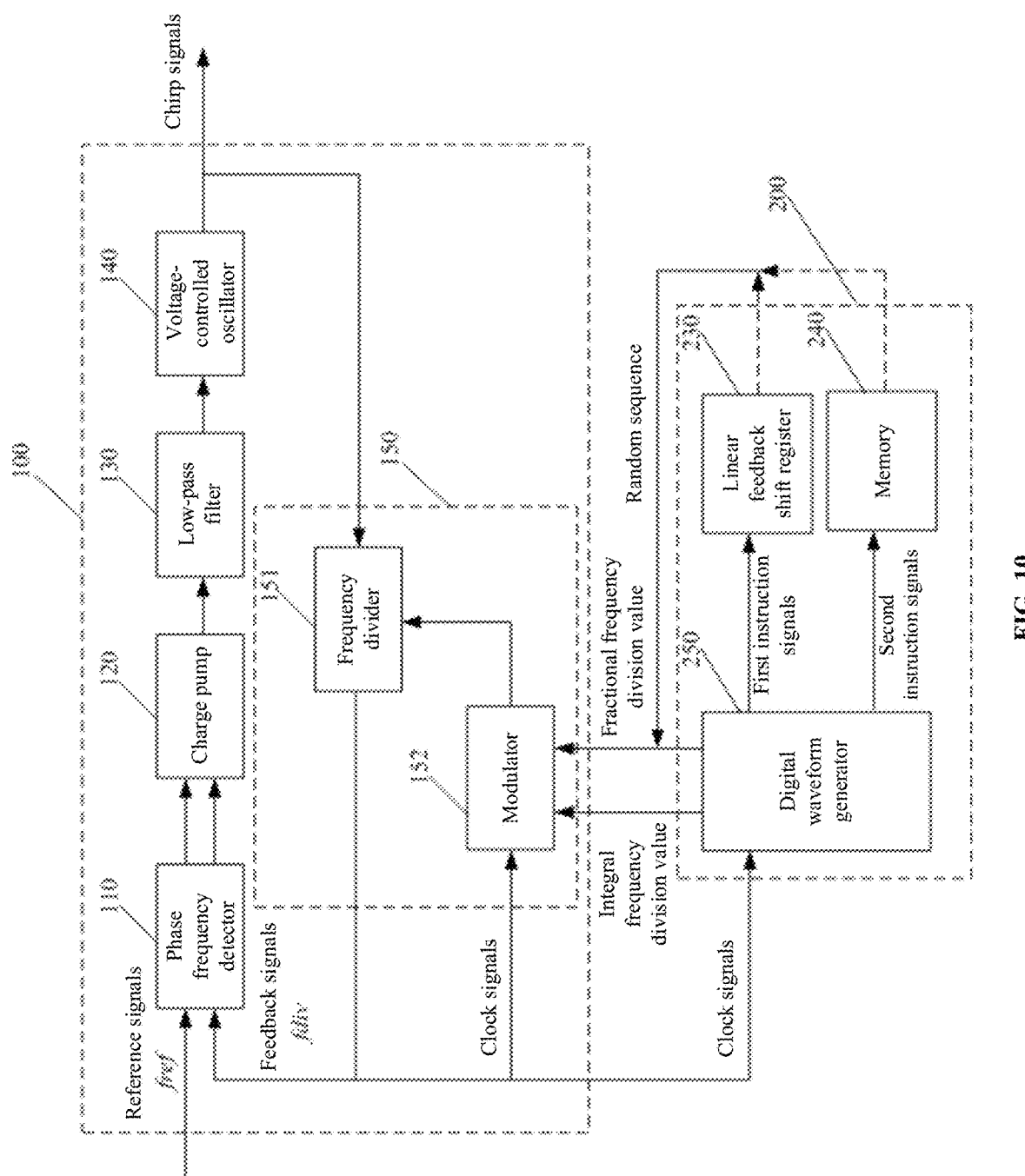

Embodiment three: as shown in FIG. 10, the random control signal generator 200 may include the linear feedback shift register 230 and the memory 240.

The control port of the linear feedback shift register 230 is configured to receive the first instruction signal generated based on the clock signal. The first instruction signal is configured to instruct the linear feedback shift register 230 to operate for one time in response to the clock signal indicating the target moment, to generate one random sequence output to the fourth input port of the phase-locked loop circuit 100, so that the accumulated value of the plurality of fractional frequency division values is converted into the random value; and/or the control port of the memory 240 is configured to receive the second instruction signal generated based on the clock signal. The second instruction signal is configured to instruct the memory 240 to output one pre-stored random sequence to the fourth input port of the phase-locked loop circuit 100 in response to the clock signal indicating the target moment, so that the accumulated value of the plurality of fractional frequency division values is converted into the random value.

It should be noted that the output arrows of the linear feedback shift register 230 and the memory 240 in FIG. 10 are dotted lines, indicating that one or more of the linear feedback shift register 230 and memory 240 send one random sequence to the fourth input port of the phase-locked loop circuit 100 in response to the clock signal indicating the target moment, so that the accumulated value of the plurality of fractional frequency division values is converted into the random value.

In the above three embodiments, the linear feedback shift register 230 is instructed by the first instruction signal to input one random sequence to the phase-locked loop circuit 100 in response to the clock signal indicating the target moment, the memory 240 is instructed by the second instruction signal to input one random sequence to the phase-locked loop circuit 100 in response to the clock signal indicating the target moment, and the first instruction signal and the second instruction signal are generated based on the clock signal.

In some embodiments, as shown in FIGS. 7, 9 and 10, the random control signal generator 200 further includes:

a digital waveform generator 250. The clock signal is input at a control port of the digital waveform generator 250. The digital waveform generator 250 is configured to identify whether the clock signal indicates the target moment, and in response to the clock signal indicating the target moment, instruct one or more of the linear feedback shift register 230 and the memory 240 to input one random sequence to the fourth input port of the phase-locked loop circuit 100, so that the accumulated value of the plurality of fractional frequency division values is converted into the random value.

In operation, the digital waveform generator 250 identifies whether the clock signal indicates the target moment, and in response to the clock signal indicating the target moment, sends the first instruction signal to the linear feedback shift register 230, to instruct the linear feedback shift register 230 to operate for one time, thereby generating one random sequence output to the fourth input port of the phase-locked loop circuit 100.

and/or the digital waveform generator 250 identifies whether the clock signal indicates the target moment, and in response to the clock signal indicating the target moment, sends the second instruction signal to the memory 240, to instruct the memory 240 to output one pre-stored random sequence to the fourth input port of the phase-locked loop circuit 100.

Figure 11:
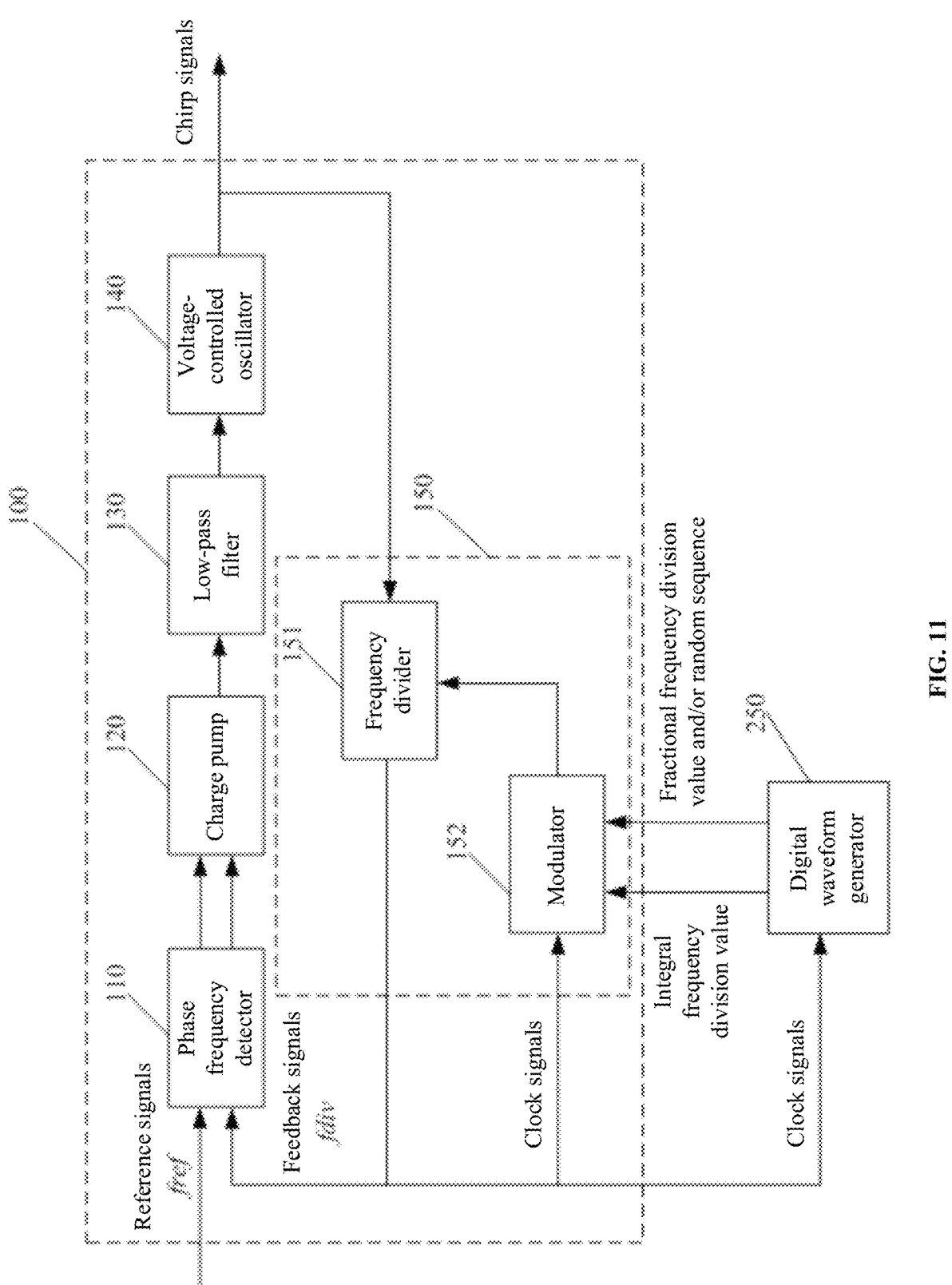

Embodiment four: as shown in FIG. 11, the random control signal generator 200 includes the digital waveform generator 250. The clock signal is input at the control port of the digital waveform generator 250. The digital waveform generator 250 is configured to identify whether the clock signal indicates the target moment, and in response to the clock signal indicating the target moment, input one random sequence to the fourth input port of the phase-locked loop circuit 100, so that the accumulated value of the plurality of fractional frequency division values is converted into the random value.

In the present embodiment, the digital waveform generator 250 has functions of not only identifying whether the clock signal indicates the target moment, but also inputting a random sequence to the fourth input port of the phase-locked loop circuit 100 in response to the clock signal indicating the target moment. Herein, the random sequence may be pre-stored in the digital waveform generator 250, or may be generated in real-time in response to the clock signal indicating the target moment. The present embodiment does not limit this.

Based on any one of the above embodiments, as shown in FIGS. 7 and 9 to 11, in some embodiments, the digital waveform generator 250 is further configured to, under control of the clock signal, input the integral frequency division value to the third input port of the phase-locked loop circuit 100, and input the plurality of fractional frequency division values to the fourth input port of the phase-locked loop circuit 100.

It is noted that in the above embodiments, as shown in FIGS. 7 and 9 to 11, the fourth input port of the phase-locked loop circuit 100 receives not only the plurality of fractional frequency division values, but also the random sequence at a target moment. This is because the fourth input port of the phase-locked loop circuit 100 can receive only one type of signals at a same moment. In view of this, the phase-locked loop circuit 100 may be implemented by that: the phase-locked loop circuit 100 receives the plurality of fractional frequency division values and the random sequence at different target moments during the useful signal time period, and receives the random sequence at another target moment. For example, as shown in FIG. 11, the relationship between the plurality of fractional frequency division values and the random sequence received at the fourth input port of the phase-locked loop circuit 100 is "OR". In some examples, when receiving the plurality of fractional frequency division values, the phase-locked loop circuit 100 accumulates the received plurality of fractional frequency division values, and when receiving the random sequence, the phase-locked loop circuit 100 adds the received random sequence with the accumulated value of the plurality of fractional frequency division values, or substitutes the accumulated value of the plurality of fractional frequency division values with the received random sequence.

The phase-locked loop circuit 100 may be alternatively implemented by that: during the useless signal time period, the random sequence is inputted at the fourth input port of the phase-locked loop circuit 100, and during the useful signal time period, the plurality of fractional frequency division values are inputted at the fourth input port of the phase-locked loop circuit 100. The fractional frequency division values and random sequence are added to obtain an accumulated value, and it is a random value. For example, as shown in FIG. 11, the relationship between the plurality of fractional frequency division values and the random sequence successively received at the fourth input port of the phase-locked loop circuit 100 is "and". In some examples, the inputted fractional frequency division value and the random sequence may be accumulated at a target time. The obtained accumulated value may be inputted, as a random sequence, at the fourth input port of the phase-locked loop circuit 100, and be added with the other fractional frequency division values, or substitutes the accumulated value of the plurality of fractional frequency division values.

On the basis of any one of the above embodiments, as shown in FIGS. 4 to 7 and 9 to 11, in some embodiments, the phase-locked loop circuit 100 further includes:

a phase frequency detector 110, a charge pump 120, a low-pass filter 130, a voltage-controlled oscillator 140 and frequency division module 150 which are electrically connected in sequence to form a loop;

a first input port of the phase frequency detector 110 is connected to the first input port of the phase-locked loop circuit 100, a second input port of the phase frequency detector 110 is connected to the second input port of the phase-locked loop circuit 100, a first input port of the frequency division module 150 is connected to the third input port of the phase-locked loop circuit 100, a second input port of the frequency division module 150 is connected to the fourth input port of the phase-locked loop circuit 100, and an output port of the voltage-controlled oscillator 140 is connected to an output port of the phase-locked loop circuit 100;

the phase frequency detector 110 is configured to detect a phase difference between the reference signal fref input at the first input port of the phase frequency detector and the feedback signal fdiv input at the second input port of the phase frequency detector, and generate a pair of phase error signals; the pair of phase error signals are converted into a voltage control signal by the charge pump 120 and the low-pass filter 130, and the voltage control signal is configured to control the voltage-controlled oscillator 140 to output the plurality of frequency-modulated continuous chirp signals; the frequency division module 150 is configured to accumulate the plurality of fractional frequency division values, and the frequency division module 150 performs frequency division on the chirp signal at the frequency division ratio, so as to generate another feedback signal fdiv that is fed to the second input port of the phase frequency detector 110, where the frequency division ratio is obtained based on the accumulated value of the plurality of fractional frequency division values and the integral frequency division value; the phase-locked loop circuit 100 maintains a locked status by maintaining frequency and a phase of the feedback signal fdiv to be same as frequency and a phase of the reference signal fref; and the frequency division module 150 is further configured to receive the random control signal at the second input port of the frequency division module in response to the clock signal indicating the target moment, so that the frequency division module 150 converts, under the control of the random control signal, the accumulated value of the plurality of fractional frequency division values into the random value.

In some embodiments, as shown in FIGS. 4 to 7 and 9 to 11, the frequency division module 150 includes a frequency divider 151 and a modulator 152.

The clock signal is input at a control port of the modulator 152, a first input port of the modulator is connected to the first input port of the frequency division module 150, and a second input port of the modulator is connected to the second input port of the frequency division module 150. The modulator 152 is configured to, under control of the clock signal, accumulate the plurality of fractional frequency division values input at the second input port of the modulator, and generate a frequency division ratio control signal and output the frequency division ratio control signal to the frequency divider 151, based on the accumulated value of the plurality of fractional frequency division values and the integral frequency division value input at the first input port of the modulator.

The frequency division ratio control signal is received at a control port of the frequency divider 151, an input port of the frequency divider is connected to the output port of the voltage-controlled oscillator 140, and an output port of the frequency divider is connected to the second input port of the phase frequency detector 110. The frequency divider 151 is configured to, under control of the frequency division ratio control signal, perform frequency division on the respective chirp signal of the plurality of chirp signals output by the voltage-controlled oscillator 140 at the frequency division ratio, and generate another feedback signal fdiv that is fed back to the second input port of the phase frequency detector 110.

The modulator 152 is further configured to receive the random control signal at the second input port of the modulator in response to the clock signal indicating the target moment, and convert, under control of the random control signal, the accumulated value of the plurality of fractional frequency division values into the random value.

The modulator (SDM) may be a E-Δ modulator configured to generate the frequency division ratio control signal.

Figure 12:
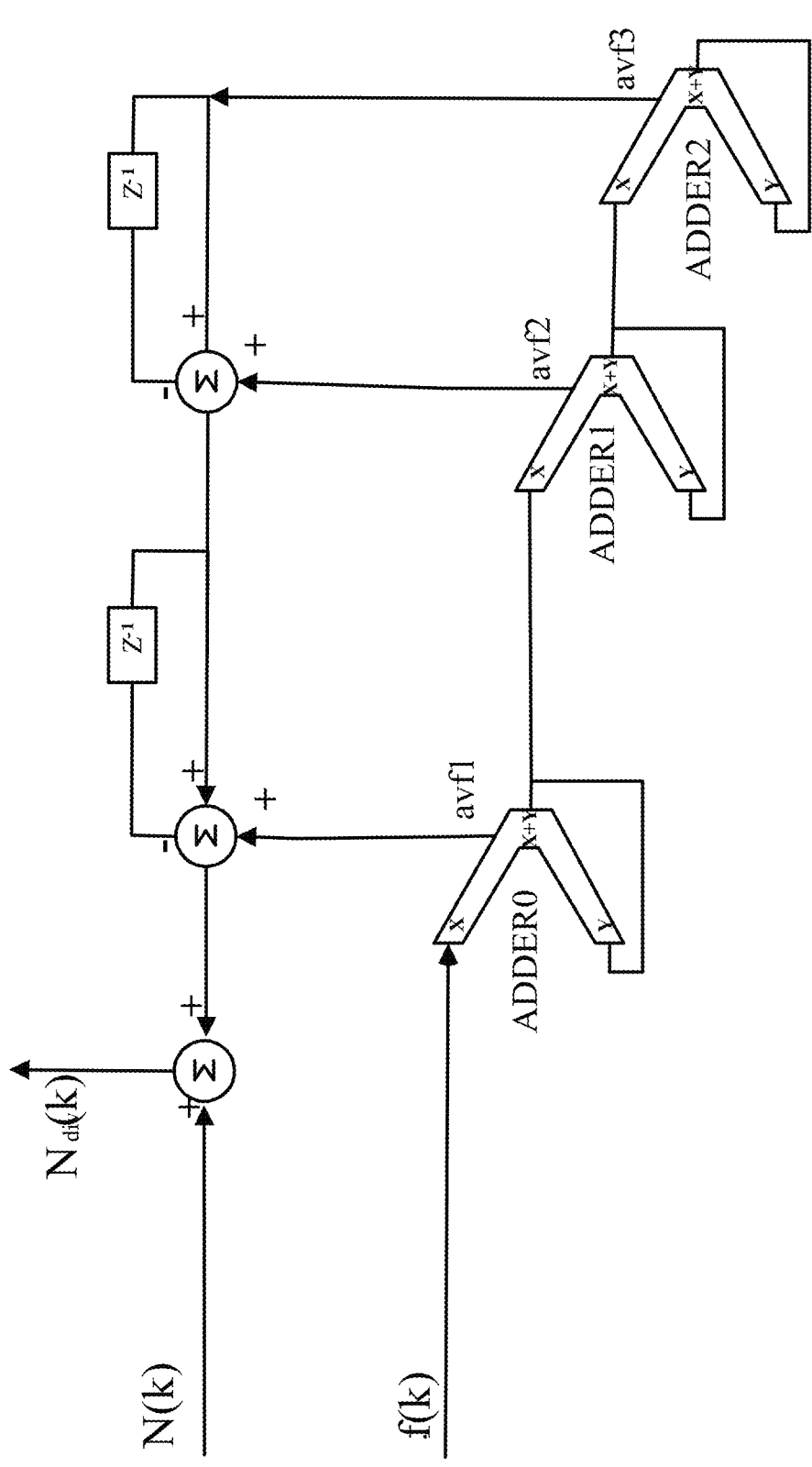
FIG. 12 is a schematic diagram of a modulator having MASH111 structure in the phase-locked loop according to some embodiments of the present disclosure.

In some embodiments, as shown in FIG. 12, the modulator 152 includes a first accumulator ADDER0. An input port of the first accumulator ADDER0 is connected to the second input port of the modulator 152 and is configured to receive the plurality of fractional frequency division values .f (k), and to receive the random control signal in response to the clock signal indicating the target moment.

The first accumulator ADDER0 is configured to accumulate each received fractional frequency division value with a historical accumulated value, and to convert, under the control of the received random control signal, a current accumulated value of the fractional frequency division value to a random value in response to the clock signal indicating the target moment.

In operation, the first accumulator ADDER0 continuously accumulates the received fractional frequency division value with the historical accumulated value. When the accumulated value exceeds the preset threshold, the first accumulator performs an overflow, i.e. outputs an overflow value. The remaining accumulated value after the overflow is accumulated, as a new accumulated value, with received fractional frequency division values. Herein, the preset threshold is the maximum value that can be expressed by the first accumulator ADDER0.

Referring to FIG. 12, the modulator 152 further includes a second accumulator ADDER1 and a third accumulator ADDER2. The second accumulator ADDER1 accumulates residual noise (i.e. quantization noise) of the first accumulator ADDER0, and performs an overflow when an accumulated value of the second accumulator exceeds a maximum value that the second accumulator ADDER1 can express. The remaining accumulated value after the overflow is accumulated, as a new accumulated value, with the residual noise of the first accumulator ADDER0. Similarly, the third accumulator ADDER2 accumulates residual noise (i.e. quantization noise) of the second accumulator ADDER1, and performs an overflow when an accumulated value of the third accumulator exceeds a maximum value that the third accumulator ADDER2 can express. The remaining accumulated value after the overflow is accumulated, as a new accumulated value, with the residual noise of the second accumulator ADDER1.

Differential processing and addition processing are performed on an overflow value avf1 of the first accumulator ADDER0, an overflow value avf2 of the second accumulator ADDER1, and an overflow value avf3 of the third accumulator ADDER2, and the processing result is added with the integral frequency division value N(k) input at the first input port of the modulator 152 to obtain the frequency division ratio control signal Ndiv(k) configured to control the frequency divider 151 to perform frequency division on the respective chirp signal of the plurality of chirp signals output by the voltage-controlled oscillator 140 at the frequency division ratio N.frac.

The inventor analyzed the structure of the MASH111 modulator and the principle of generating spurious signals in the phase-locked loop, and found that the second accumulator ADDER1 quantifies the residual noise of the first accumulator ADDER0, and the third accumulator ADDER2 quantifies the residual noise of the second accumulator ADDER1, that is to say, the second accumulator ADDER1 and the third accumulator ADDER2 are mainly related to the transfer function of the noise, but not to the transfer function of the signals. The first accumulator ADDER0 quantizes the inputted plurality of fractional frequency division values .f(k), therefore, the characteristics (such as phase) of the inputted plurality of fractional frequency division values .f(k) are mainly determined by the first accumulator ADDER0. That is to say, the first accumulator ADDER0 determines the fractional part frac of the fractional frequency division ratio of the frequency divider 151, thereby determining the phases of the spurious signals in the plurality of chirp signals, and further determining the phase difference of a respective spurious signal relative to a respective main signal in each respective chirp signal of the plurality of chirp signals.

Thus, in response to the clock signal indicating a target moment, the input port of the first accumulator ADDER0 receives the random control signal, so that the first accumulator ADDER0 converts, under the control of the random control signal, the accumulated value of the plurality of fractional frequency division values into a random value. For example, the random control signal is a random sequence, and the input port of the first accumulator ADDER0 receives a random sequence in response to the clock signal indicating a target moment. The random sequence is added with or substitutes the accumulated value of the plurality of fractional frequency division values in the first accumulator ADDER0, so that the accumulated value of the plurality of fractional frequency division values in the first accumulator ADDER0 is converted to a random value. Thus, the spurious signals in the chirp signals have random phases, and the phase differences between phases of the spurious signals and initial phases of the main signals in the plurality of chirp signals are random phase differences. Moreover, the phase differences of the main signals in the plurality of chirp signals relative to the reference signal are random, in other words, the plurality of chirp signals have random phases.

It should be noted that, as described above, the feedback signal fdiv may be used as a clock signal. In this case, as shown in FIGS. 9 to 11, the control port of the modulator 152 and the control port of the digital waveform generator 250 may be connected to the output port of the frequency divider 151 to simplify the structure of the phase-locked loop.

It should also be noted that in practical applications, there is time delay among inputting, by the digital waveform generator 250, integral and fractional frequency division signals to the modulator 152, inputting, by the modulator 152, the frequency division ratio control signal to the frequency divider 151, and performing, by the frequency divider 151, frequency division under the control of the frequency division ratio control signal on the chirp signal at the frequency division ratio. That is to say, each process occurs following the respective clock signal.

Figure 13:
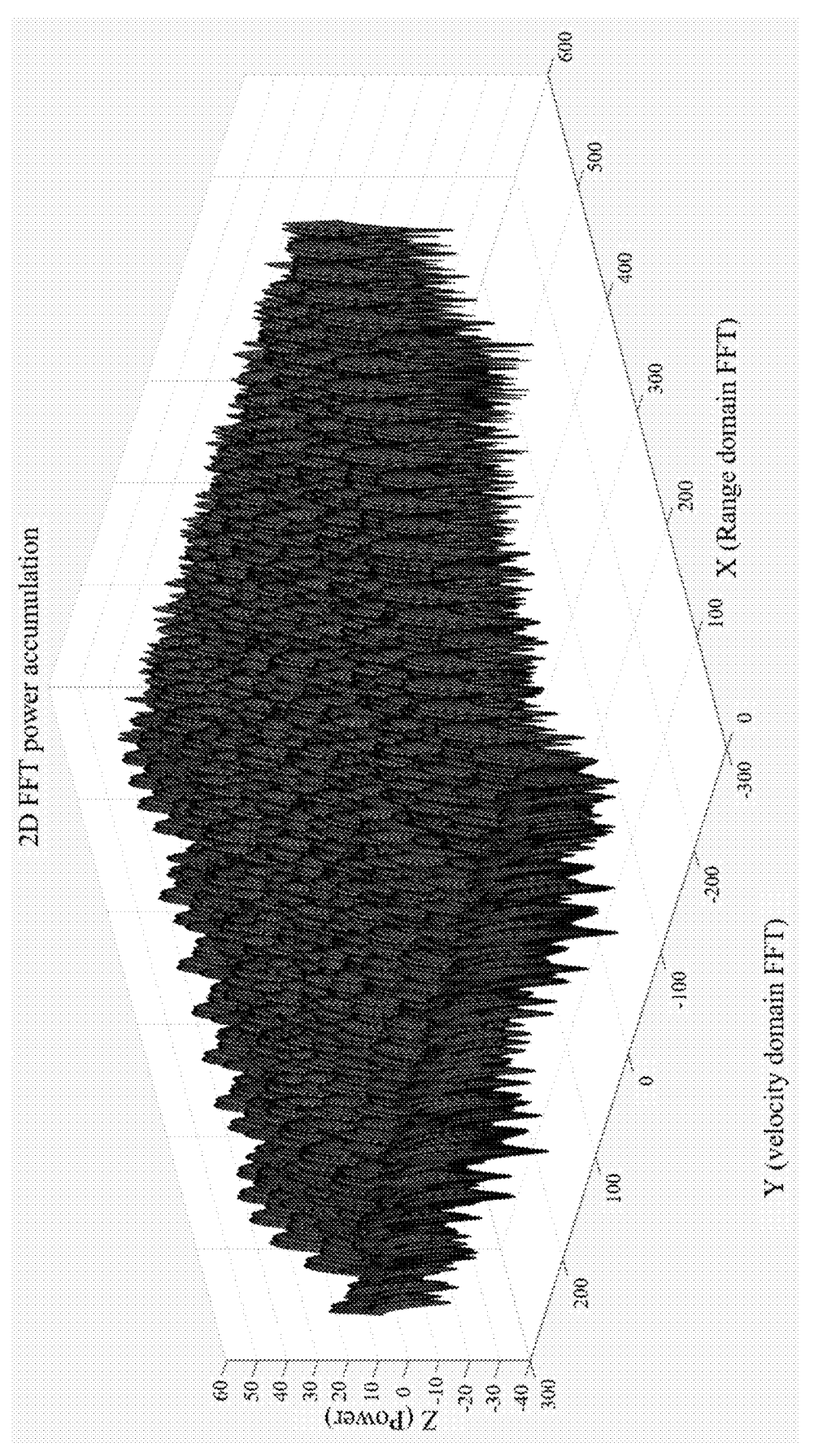
FIG. 13 is a schematic diagram of a result of 2D FFT processing performed on the plurality of chirp signals output by the phase-locked loop according to some embodiments of the present disclosure.

FIG. 13 shows a schematic diagram of a result of 2D FFT processing performed on the plurality of chirp signals output by the phase-locked loop according to some embodiments of the present disclosure. It can be seen by comparing FIG. 3 with FIG. 13 that in FIG. 3, the velocity strays on the velocity dimension are distributed over different velocity values, thereby reducing energy of the velocity strays. In this way, the two false objects having fixed velocities can be prevented from occurring in the radar system, thereby improving the detection accuracy of the radar system.

Some embodiments of the present disclosure further provide a radar system, including the phase-locked loop according to any one of the above embodiments. Herein, the phase-locked loop is configured to generate a plurality of frequency-modulated continuous chirp signals, i.e. a plurality of frequency-modulated continuous wave signals The specific operation process of the phase-locked loop has been described in detail in the above embodiments, and will not be repeated here.

Some embodiments of the present disclosure further provide a method for randomizing an initial phase of a FMCW signal, applicable to a phase-locked loop including a phase-locked loop circuit 100. As shown in FIG. 14, the method includes the following operations.

At S100, a reference signal and a feedback signal are received at the phase-locked loop circuit, and the phase-locked loop circuit generates a respective chirp signal of a plurality of frequency-modulated continuous chirp signals.

There is a phase difference between a phase of a spurious signal and an initial phase of a main signal in each respective chirp signal of the plurality of chirp signals. An integral frequency division value and a plurality of fractional frequency division values are received at the phase-locked loop circuit, and the phase-locked loop circuit performs frequency division on the chirp signal at a frequency division ratio to generate another feedback signal, where the frequency division ratio is obtained based on an accumulated value of the plurality of fractional frequency division values and on the integral frequency division value.

At S200, a random control signal is received at the phase-locked loop circuit at each target moment, to randomize the accumulated value of the plurality of fractional frequency division values, such that a plurality of phase differences respectively corresponding to the plurality of chirp signals form a non-arithmetic sequence.

It should be noted that a phase difference between a phase of a spurious signal and an initial phase of a main signal in a respective chirp signal of the plurality of chirp signals refers to a phase difference of the spurious signal relative to the main signal at an initial moment of the respective chirp signal of the plurality of chirp signals. Herein, the initial moment of the respective chirp signal of the plurality of chirp signals generated by the phase-locked loop circuit 100 may be the moment such as t1, t4, t7, or the like as shown in FIG. 1. Thus, at any moment or a plurality of moments within a cycle of a respective chirp signal output by phase-locked loop circuit 100, the accumulated value of the plurality of fractional frequency division values is randomized, so that a phase difference of a spurious signal relative to a main signal in the respective chirp signal varies randomly at this moment, and a phase difference of a spurious signal relative to a main signal in a next chirp signal also varies randomly at an initial moment of the next chirp signal. In this case, both the phase differences of the spurious signals relative to the main signals in the two chirp signals vary randomly. Similarly, a plurality of phase differences between phases of a plurality of spurious signals and initial phases of a plurality of respective main signals in the plurality of chirp signals form a non-arithmetic sequence. It can be seen that the one or more target moments may be any moment or a plurality of moments within the cycle of the respective chirp signal.

A cycle of any chirp signal has a useful signal time period and a useless signal time period. For example, as shown in FIG. 1, the useful signal time period includes a rising time period, and the useless signal time period includes a falling time period and a waiting time period. For another example, as shown in FIG. 1, the useful signal time period includes the falling time period, and the useless signal time period includes the rising time period and the waiting time period. Therefore, in order to prevent affecting the useful signal time period of the chirp signal, in some embodiments of the present disclosure, the one or more target moments refer to one or more moments within a time period starting from an ending moment of a useful signal time period of a respective chirp signal of the plurality of chirp signals and ending at a beginning moment of a useful signal time period of a next chirp signal.

In some embodiments, a target moment may be an initial moment of a useful signal time period of a respective chirp signal. For example, as shown in FIG. 1, the one or more useful signal time periods of the respective one or more chirp signals are one or more rising time periods, then the one or more target moments may refer to the moments t1, t4, t7, and the like.

In some embodiments, the one or more target moments may refer to one or more moments within a useless signal time period of a respective chirp signal. For example, as shown in FIG. 1, the useful signal time period of the respective chirp signal is the rising time period, and the useless signal time period of the respective chirp signal is the falling time period and the waiting time period. Then, the one or more target moments may refer to one or more moments within the falling time period and the waiting time period of the respective chirp signal.

It should also be noted that the one or more target moments should correspond to the plurality of chirp signals in the time domain, and when the phase-locked loop circuit 100 is locked, the reference signal fref and the feedback signal fdiv both correspond to a respective chirp signal of the plurality of frequency-modulated continuous chirp signals in the time domain. Therefore, the one or more target moments may be determined based on the reference signal fref or the feedback signal fdiv.

In some embodiments, the one or more target moments are determined based on the feedback signal fdiv. For example, the feedback signal fdiv may be used as the clock signal. In response to the feedback signal fdiv indicating a target moment, a random control signal is received at the phase-locked loop circuit 100, in order to randomize the accumulated value of the plurality of fractional frequency division values.

During generation of the plurality of chirp signals by the phase-locked loop circuit 100, a random control signal is received at the phase-locked loop circuit 100 at each target moment, to randomize the accumulated value of the plurality of fractional frequency division values, so that a plurality of phase differences between phases of a plurality of spurious signals and initial phases of a plurality of respective main signals in the plurality of chirp signals form a non-arithmetic sequence. In other words, the equal-difference manner in which the plurality of phase differences increase or decrease is disrupted, and a plurality of pieces of velocity information resulting from the spurious signals in the plurality of chirp signals are distributed over different velocity values. In this way, a strength of the spurious signals on individual velocity dimension can be decreased, and the two false objects having fixed velocities can be prevented from occurring in the radar system, thereby improving the detection accuracy of the radar system. Moreover, at each target moment, the accumulated value of the plurality of fractional frequency division values is randomized, such that the phase differences of the main signals in the plurality of chirp signals relative to the reference signal fref vary randomly. In other words, the phases of the plurality of chirp signals emitted by the FMCW radar system vary randomly. In this way, the probability of signals emitted by the FMCW radar being interfered by other radar signals can be reduced, thereby improving the anti-interference ability of the FMCW radar system to external environment.

In the above embodiments, the random control signal may be an instruction signal or a data signal, which will be described in detail below.

When the random control signal is an instruction signal, in response to the clock signal indicating a target moment, the phase-locked loop circuit 100 is instructed by the random control signal to convert the accumulated value of the plurality of fractional frequency division values into a random value, so that a plurality of phase differences between phases of a plurality of spurious signals and initial phases of a plurality of respective main signals in the plurality of chirp signals form a non-arithmetic sequence.

Based on this, there are a plurality of methods for identifying whether the clock signal indicates a target moment. In some embodiments, the moment when the phase-locked loop circuit 100 receives the random control signal may be set as a target moment. Upon receiving the random control signal, the phase-locked loop circuit 100 randomize the accumulated value of the plurality of fractional frequency division values. Alternatively, a processor 210 may be utilized to identify whether the clock signal indicates a target moment. In response to the clock signal indicating the target moment, the processor instructs to input the random control signal to the phase-locked loop circuit 100, and the phase-locked loop circuit 100 randomize the accumulated value of the plurality of fractional frequency division values under control of the random control signal. Alternatively, the random control signal may be configured to instruct the phase-locked loop circuit 100 to identify whether the clock signal indicates the target moment. In response to the clock signal indicating the target moment, the accumulated value of the plurality of fractional frequency division values is randomized.

When the random control signal is a data signal, since the accumulated value of the plurality of fractional frequency division values is in a form of binary data of 0 and 1, the random control signal may include a random sequence also in the form of binary data of 0 and 1.

Based on this, in some embodiments, as shown in FIG. 15, the operation of inputting the random control signal to the phase-locked loop circuit 100 at each target moment, to randomize the accumulated value of the plurality of fractional frequency division values includes the following operations.

At S210, the random sequence is inputted to the phase-locked loop circuit at one or more target moments.

At S220, the random sequence is added with the accumulated value of the plurality of fractional frequency division values, or the random sequence substitutes the accumulated value of the plurality of fractional frequency division values, so that the accumulated value of the plurality of fractional frequency division values is converted into the random value, and that the plurality of phase differences between phases of the plurality of spurious signals and initial phases of the plurality of respective main signals in the plurality of chirp signals form a non-arithmetic sequence.

Because in the accumulated value of the plurality of fractional frequency division values, high-order bits have relatively high weights, in order to achieve better randomness in the accumulated value of the plurality of fractional frequency division values by the random sequence, the operation of adding the random sequence with the accumulated value of the plurality of fractional frequency division values includes the operation of: adding, from high-order bits to low-order bits of the accumulated value, the random sequence with the accumulated value bit by bit.

The operation of substituting the accumulated value of the plurality of fractional frequency division values of the phase-locked loop circuit with the random sequence includes the operation of: substituting, from high-order bits to low-order bits of the accumulated value, the accumulated value with the random sequence bit by bit.

By adding, bit by bit, the random sequence with the accumulated value from high-order bits to low-order bits of the accumulated value, or substituting, bit by bit, the accumulated value with the random sequence from high-order bits to low-order bits of the accumulated value, significant disturbance can be brought to the accumulated value of the plurality of fractional frequency division values, and the higher order of the bit of the accumulated value of the plurality of fractional frequency division values, the greater the disturbance caused by the random sequence.

For example, the accumulated value of the plurality of fractional frequency division values has M bits, the random sequence has N bits, and M≥N. The random sequence may be added with or substitutes, from high-order bits to low-order bits of the accumulated value, N bits of the accumulated value of the plurality of fractional frequency division values bit by bit, in order to obtain better random effects.

It should be noted that in S210, at each target moment, the random sequence input to the phase-locked loop circuit 100 may be only a random sequence, or may be an accumulated value of a random sequence and the plurality of fractional frequency division values. Because the accumulated value of the random sequence and the plurality of fractional frequency division values is also a random sequence, this accumulated value may also be used to be added with or substitutes the accumulated value of the plurality of fractional frequency division values.

The present disclosure provides a phase-locked loop, a radar system and a method for randomizing initial phases of FMCW signals. The phase-locked loop includes a phase-locked loop circuit 100 and a random control signal generator 200. In response to the clock signal indicating a target moment, the random control signal generator 200 inputs a random control signal to the phase-locked loop circuit 100, so that the accumulated value of the plurality of fractional frequency division values is converted into a random value, and that a plurality of phase differences respectively corresponding to the plurality of chirp signals form a non-arithmetic sequence. In other words, the equal-difference manner in which the plurality of phase differences increase or decrease is disrupted, and a plurality of pieces of velocity information resulting from the spurious signals in the plurality of chirp signals are distributed over different velocity dimensions. In this way, a strength of the spurious signals on individual velocity dimension can be decreased, and the two false objects having fixed velocities can be prevented from occurring in the radar system, thereby improving the detection accuracy of the radar system. Moreover, the plurality of chirp signals can have random phases, thereby improving the anti-interference ability of the FMCW radar system to external environment.

The parts of the above description are described in parallel and progressively. Each part focuses on the differences from other parts, and the same and similar parts between each part may be referred to each other.

In the above description of the disclosed embodiments, the features described in the embodiments in the description may be substituted or combine with each other, enabling those skilled in the art to implement or use the present disclosure. The various modifications to these embodiments will be apparent to those skilled in the art, and the general principles defined in the present disclosure may be implemented in other embodiments without departing from the spirit or scope of the present disclosure. Therefore, the present disclosure shall not be limited to the embodiments described herein, but rather to the widest scope consistent with the principles and novel features disclosed herein.

What is claimed is:

1. A phase-locked loop, comprising:
a phase-locked loop circuit, having a first input port, a second input port, and a frequency division value input port; and a random control signal generator, including a control port configured to receive a clock signal;
wherein the phase-locked loop circuit is configured to generate a plurality of frequency-modulated continuous chirp signals;
wherein, in response to a reference signal being input at the first input port, a feedback signal being input at the second input port, a frequency division value being input at the frequency division value input port, the frequency division value having an integral part and a fractional part, the fractional part being an accumulated value of a plurality of fractional frequency division values,
the phase-locked loop circuit is configured to generate a respective chirp signal of the plurality of frequency-modulated continuous chirp signals based on the reference signal and the feedback signal, and to perform frequency division on the respective chirp signal at a frequency division ratio obtained based on the frequency division value, to generate another feedback signal that is fed back to the second input port; and
wherein there is a phase difference between a phase of a spurious signal and an initial phase of a main signal in the respective chirp signal, the spurious signal being generated in response to the respective chirp signal being subjected to instantaneous phase changes caused by variation of the frequency division value between an integer and a next integer; and
wherein in response to the clock signal reaching a target moment, the random control signal generator is configured to send a random control signal to the frequency division value input port of the phase-locked loop circuit, causing the accumulated value of the plurality of fractional frequency division values to be converted into a random value, and a plurality of phase differences respectively corresponding to the plurality of chirp signals to form a non-arithmetic sequence.

2. The phase-locked loop according to claim 1, wherein the target moments refers to a moments within a time period starting from an ending moment of a useful signal time period of a respective chirp signal of the plurality of chirp signals and ending at a beginning moment of a useful signal time period of a next chirp signal.

3. The phase-locked loop according to claim 2, wherein the random control signal includes a random sequence configured to add with or substitute the accumulated value of the plurality of fractional frequency division values, so that the accumulated value of the plurality of fractional frequency division values is converted into the random value.

4. The phase-locked loop according to claim 3, wherein the random sequence is added with or substitutes the accumulated value bit by bit.

5. The phase-locked loop according to claim 1, wherein the random control signal includes a random sequence configured to add with or substitute the accumulated value of the plurality of fractional frequency division values, so that the accumulated value of the plurality of fractional frequency division values is converted into the random value.

6. The phase-locked loop according to claim 5, wherein the random sequence is added with or substitutes the accumulated value bit by bit.

7. The phase-locked loop according to claim 6, wherein the random control signal generator includes one or more of:

a linear feedback shift register, wherein a control port of the linear feedback shift register is configured to receive a first instruction signal generated based on the clock signal, wherein the first instruction signal is configured to instruct the linear feedback shift register to operate to generate one random sequence output to the frequency division value input port of the phase-locked loop circuit, so that the accumulated value of the plurality of fractional frequency division values is converted into the random value; and a memory, wherein a control port of the memory is configured to receive a second instruction signal generated based on the clock signal, wherein the second instruction signal is configured to instruct the memory to output one pre-stored random sequence to the frequency division value input port of the phase-locked loop circuit, so that the accumulated value of the plurality of fractional frequency division values is converted into the random value.

8. The phase-locked loop according to claim 7, wherein the random control signal generator further includes:

a digital waveform generator, wherein the clock signal is input at a control port of the digital waveform generator, and the digital waveform generator is configured to identify whether the clock signal indicates the target moment, and in response to the clock signal reaching the target moment, instruct one or more of the linear feedback shift register and the memory to input one random sequence to the frequency division value input port of the phase-locked loop circuit, so that the accumulated value of the plurality of fractional frequency division values is converted into the random value.

9. The phase-locked loop according to claim 8, wherein the digital waveform generator is further configured to, under control of the clock signal, input the frequency division value to the frequency division value input port of the phase-locked loop circuit.

10. The phase-locked loop according to claim 5, wherein the random control signal generator includes one or more of:

a linear feedback shift register, wherein a control port of the linear feedback shift register is configured to receive a first instruction signal generated based on the clock signal, wherein the first instruction signal is configured to instruct the linear feedback shift register to operate to generate one random sequence output to the frequency division value input port of the phase-locked loop circuit, so that the accumulated value of the plurality of fractional frequency division values is converted into the random value; and a memory, wherein a control port of the memory is configured to receive a second instruction signal generated based on the clock signal, wherein the second instruction signal is configured to instruct the memory to output one pre-stored random sequence to the frequency division value input port of the phase-locked loop circuit, so that the accumulated value of the plurality of fractional frequency division values is converted into the random value.

11. The phase-locked loop according to claim 10, wherein the random control signal generator further includes:

a digital waveform generator, wherein the clock signal is input at a control port of the digital waveform generator, and the digital waveform generator is configured to identify whether the clock signal indicates the target moment, and in response to the clock signal reaching the target moment, instruct one or more of the linear feedback shift register and the memory to input one random sequence to the frequency division value input port of the phase-locked loop circuit, so that the accumulated value of the plurality of fractional frequency division values is converted into the random value.

12. The phase-locked loop according to claim 11, wherein the digital waveform generator is further configured to, under control of the clock signal, input the frequency division value to the frequency division value input port of the phase-locked loop circuit.

13. The phase-locked loop according to claim 1, wherein the frequency division value input port includes a third input port and a fourth input port; and the phase-locked loop circuit further includes:

a phase frequency detector, a charge pump, a low-pass filter, a voltage-controlled oscillator and a frequency division module electrically connected in sequence to form a loop;

wherein a first input port of the phase frequency detector is connected to the first input port of the phase-locked loop circuit, a second input port of the phase frequency detector is connected to the second input port of the phase-locked loop circuit, a first input port of the frequency division module is connected to the third input port of the phase-locked loop circuit, a second input port of the frequency division module is connected to the fourth input port of the phase-locked loop circuit, and an output port of the voltage-controlled oscillator is connected to an output port of the phase-locked loop circuit;

wherein the phase frequency detector is configured to detect a phase difference between the reference signal and the feedback signal, and generate a plurality of phase error signals, wherein the plurality of phase error signals are converted into a voltage control signal by the charge pump and the low-pass filter, and the voltage control signal is configured to control the voltage-controlled oscillator to output the respective chirp signal of the plurality of frequency-modulated continuous chirp signals, and wherein the frequency division module is configured to accumulate the plurality of fractional frequency division values, and perform frequency division on the respective chirp signal of the plurality of chirp signals at the frequency division ratio obtained based on the accumulated value of the plurality of fractional frequency division values and on the integral frequency division value input at the first input port of the frequency division module, to generate the another feedback signal that is fed back to the second input port of the phase frequency detector, wherein the phase-locked loop circuit maintains a locked status by maintaining frequency and a phase of the feedback signal to be same as frequency and a phase of the reference signal; and wherein the frequency division module is further configured to receive the random control signal at the second input port of the frequency division module, so that the frequency division module converts, under control of the random control signal, the accumulated value of the plurality of fractional frequency division values into the random value.

14. The phase-locked loop according to claim 13, wherein the frequency division module includes a frequency divider and a modulator;

wherein the clock signal is input at a control port of the modulator, a first input port of the modulator is connected to the first input port of the frequency division module, and a second input port of the modulator is connected to the second input port of the frequency division module, and wherein the modulator is configured to, under control of the clock signal, accumulate the plurality of fractional frequency division values input at the second input port of the modulator, and generate, based on the accumulated value of the plurality of fractional frequency division values and the integral frequency division value input at the first input port of the modulator, a frequency division ratio control signal and output the frequency division ratio control signal to the frequency divider;

wherein the frequency division ratio control signal is received at a control port of the frequency divider, an input port of the frequency divider is connected to the output port of the voltage-controlled oscillator, and an output port of the frequency divider is connected to the second input port of the phase frequency detector, and wherein the frequency divider is configured to, under control of the frequency division ratio control signal, perform frequency division on the respective chirp signal of the plurality of chirp signals output by the voltage-controlled oscillator at the frequency division ratio, and generate the another feedback signal that is fed back to the second input port of the phase frequency detector; and wherein the modulator is further configured to receive the random control signal at the second input port of the modulator, and convert, under control of the random control signal, the accumulated value of the plurality of fractional frequency division values into the random value.

15. The phase-locked loop according to claim 1, wherein the spurious signal is generated by mixing the feedback signal generated by the frequency division with the reference signal input to the phase-locked loop.

16. A radar system, comprising the phase-locked loop according to claim 1, wherein the phase-locked loop is configured to generate a plurality of frequency-modulated continuous chirp signals.

17. A method for randomizing an initial phase of a frequency-modulated continuous wave (FMCW) signal, applicable to a phase-locked loop including a phase-locked loop circuit, the method comprises:

receiving a reference signal and a feedback signal at the phase-locked loop circuit;

generating, by the phase-locked loop circuit, a respective chirp signal of a plurality of frequency-modulated continuous chirp signals, wherein there is a phase difference between a phase of a spurious signal and an initial phase of a main signal in the respective chirp signal of the plurality of chirp signals, the spurious signal being generated in response to the respective chirp signal of the plurality of chirp signals being subjected to instantaneous phase changes caused by variation of a frequency division value between an integer and a next integer, the frequency division value including an integer part and a fractional part, the fractional part being an accumulated value of a plurality of fractional frequency division values;

receiving the frequency division value;

performing, by the phase-locked loop circuit, frequency division on the plurality of chirp signals at a frequency division ratio obtained based on the frequency division value; and randomizing the accumulated value, such that a plurality of phase differences respectively corresponding to the plurality of chirp signals form a non-arithmetic sequence, in response to receiving a random control signal at the phase-locked loop circuit at a target moment.

18. The method according to claim 17, wherein the target moments are is determined based on the feedback signal.

19. The method according to claim 17, wherein the random control signal includes a random sequence, and receiving the random control signal at the phase-locked loop circuit at the target moment, to randomize the accumulated value of the plurality of fractional frequency division values, includes:

receiving the random sequence at the phase-locked loop circuit at the target moment; and adding the random sequence with the accumulated value of the plurality of fractional frequency division values, or substituting the accumulated value of the plurality of fractional frequency division values with the random sequence, so that the accumulated value of the plurality of fractional frequency division values is converted into the random value.

20. The method according to claim 19, wherein adding the random sequence with the accumulated value of the plurality of fractional frequency division values, includes:

adding, from high-order bits to low-order bits of the accumulated value, the random sequence with the accumulated value of the plurality of fractional frequency division values bit by bit; or substituting the accumulated value of the plurality of fractional frequency division values with the random sequence, includes:

substituting, from high-order bits to low-order bits of the accumulated value, the accumulated value of the plurality of fractional frequency division values with the random sequence bit by bit.

* * * * *